United States Patent
Swager et al.

(10) Patent No.: US 9,441,163 B2
(45) Date of Patent: Sep. 13, 2016

(54) PHOTOALIGNMENT OF MATERIALS INCLUDING LIQUID CRYSTALS

(71) Applicant: Massachusetts Institute of Technology, Cambridge, MA (US)

(72) Inventors: Timothy M. Swager, Newton, MA (US); Jason R. Cox, Worcester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 579 days.

(21) Appl. No.: 13/786,904

(22) Filed: Mar. 6, 2013

(65) Prior Publication Data

US 2013/0333612 A1   Dec. 19, 2013

Related U.S. Application Data

(60) Provisional application No. 61/655,032, filed on Jun. 4, 2012.

(51) Int. Cl.

| | |
|---|---|
| *C09K 19/56* | (2006.01) |
| *G02F 1/1337* | (2006.01) |
| *C08G 61/02* | (2006.01) |
| *C08G 16/00* | (2006.01) |
| *C30B 30/00* | (2006.01) |
| *C30B 19/12* | (2006.01) |

(52) U.S. Cl.
CPC ............. *C09K 19/56* (2013.01); *C08G 16/00* (2013.01); *C08G 61/02* (2013.01); *C30B 19/12* (2013.01); *C30B 30/00* (2013.01); *G02F 1/133788* (2013.01); *C08G 2261/3422* (2013.01); *C08G 2261/41* (2013.01); *C08G 2261/72* (2013.01); *C08G 2261/92* (2013.01); *C08G 2261/94* (2013.01); *C08G 2261/95* (2013.01)

(58) Field of Classification Search
CPC .......... C08G 61/02; C08G 2261/3422; C08G 2261/41; C08G 2261/92; C09K 19/56; G02F 1/133788
See application file for complete search history.

(56) References Cited

U.S. PATENT DOCUMENTS

| | | | |
|---|---|---|---|
| 6,660,132 B1 | 12/2003 | Demuth et al. | |
| 6,783,814 B2 | 8/2004 | Swager et al. | |
| 7,208,122 B2 | 4/2007 | Swager et al. | |
| 2005/0196775 A1 | 9/2005 | Swager et al. | |
| 2010/0091222 A1 | 4/2010 | Swager | |

OTHER PUBLICATIONS

International Search Report and Written Opinion mailed Oct. 25, 2013 for International Application No. PCT/US2013/029348.
Ihmels et al., Synthesis of cationic dibenzosemibullvalene-based phase-transfer catalysts by di-π-methane rearrangements of pyrrolinium-annelated dibenzobarrelene derivatives. Beilstein J Org Chem. Jan. 26, 2011;7:119-26.

(Continued)

*Primary Examiner* — Shean C Wu
(74) *Attorney, Agent, or Firm* — Wolf, Greenfield & Sacks, P.C.

(57) ABSTRACT

Embodiments described herein relate to compositions, devices, and methods for the alignment of certain materials including liquid crystals. In some cases, a photoresponsive material include a moiety capable of undergoing a di-pi-methane rearrangement. Methods described herein may provide chemically and/or thermally stable alignment materials for use in a various technologies, including transistors, luminescent devices, and liquid crystal devices.

24 Claims, 8 Drawing Sheets

(56) References Cited

OTHER PUBLICATIONS

International Preliminary Report on Patentability mailed May 14, 2015 in connection with Application No. PCT/US2013/029348.
Bunz, Poly(aryleneethynylene)s: Syntheses, properties, structures, and applications. Chem Rev. Mar. 14, 2000;100(4):1605-44.
Christensen et al., Gelation of copolymers with pendent benzophenone photo-cross-linkers. Macromolecules. Jun. 6, 2012;45(12):5237-46.
Cox et al., Photoalignment layers for liquid crystals from the di-π-methane rearrangement. J Am Chem Soc. Jan. 16, 2013;135(2):640-3. Epub Jan. 2, 2013.
Cox, The design and synthesis of polymeric assemblies for materials applications: Chemosensing, liquid crystal alignment and block copolymers. Ph.D. Thesis, MIT. Catalogued Jun. 25, 2012. 141 pages.
Dorman et al., Benzophenone photophores in biochemistry. Biochemistry. May 17, 1994;33(19):5661-73.
Hixson et al., Di-.pi.-methane and oxa-di-.pi.-methane rearrangements. Chem Rev. Oct. 1973;73(5):531-51.
Ichimura, Photoalignment of Liquid-Crystal Systems. Chem Rev. May 10, 2000;100(5):1847-1873.
Kawatsuki, Photoalignment and photoinduced molecular reorientation of photosensitive materials. Chem Lett. 2011;40(6):548-54.
Kim et al., Technical evolution of liquid crystal displays. NPG Asia Materials. 2009;1:29-36.
Lee et al., 16.1: Invited Paper: A Novel Outdoor Readability of Portable TFT-LCD with AFFS Technology. SID Symposium Digest of Technical Papers. Jun. 2006;37(1):1079-82.
Long et al., Minimization of free volume: Alignment of triptycenes in liquid crystals and stretched polymers. Adv Mater. Apr. 2001;13(8):601-4.
Long et al., Using "internal free volume" to increase chromophore alignment. J Am Chem Soc. Apr. 17, 2002;124(15):3826-7.
Schadt et al., Voltage-dependent optical activity of a twisted nematic liquid crystal. Appl Phys Lett. Feb. 15, 1971;18(4):127-8.
Yaroshchuk et al., Photoalignment of liquid crystals: basics and current trends. J Mater Chem. 2012;22:286-300.
Zhu et al., Conjugated polymer liquid crystal solutions: control of conformation and alignment. J Am Chem Soc. Aug. 21, 2002;124(33):9670-1.
Zimmerman et al., Control of photochemical reaction pathways by excited-state multiplicity. Mechanistic and exploratory organic photochemistry. XXXIV. J Am Chem Soc. Jul. 1968;90(15):4191-3.
Zimmerman et al., Synthetic Aspects of the Di-pi-methane Rearrangement. Chem Rev. Dec. 19, 1996;96(8):3065-3112.
Zimmerman et al., The Chemistry of Barrelene. III. A unique photoisomerization to semibullvalene. J Am Chem Soc. Jan. 5, 1966;88(1):183-4.
Zimmerman et al., The photochemistry of benzobarrelene. Mechanistic and exploratory photochemistry. XXXV. J Am Chem Soc. Oct. 23, 1968;90(22):6096-108.
Arjona et al., Diels—Alder Reactions of Masked o-Benzoquinones: New Experimental Findings and a Theoretical Study of the Inverse Electron Demand Case. J. Org. Chem. 2004. 69(7): 2348-54. DOI: 10.1021/jo030307r.
Arcadi et al., Palladium-catalyzed preparation of exo-aryl derivatives of the norbornane skeleton. J. Organomet. Chem. Jun. 6, 1989. 368(2):249-56.
Bao et al, Conjugated liquid-crystalline polymers—soluble and fusible poly(phenylenevinylene) by the Heck coupling reaction. Macromolecules. 1993. 26(20): 5281-6. DOI: 10.1021/ma00072a002.
Beeckman et al., Liquid-crystal photonic applications . Optical Engineering. 2011. 50(8): 081202-1. doi:10.1117/1.3565046.
Brion, On the lewis acid catalyzed diels-alder reaction of furan. regio- and stereospecific synthesis of substituted cyclohexenols and cyclohexadienols. Tetrahedron Lett. 1982. 23(50): 5299-5302. doi:10.1016/S0040-4039(00)85823-2.
Brochon et al., Controlled radical polymerizations as versatile synthetic routes for conjugated rod-coil block copolymers and their use as active polymer semiconducting materials in flexible organic electronic devices and systems. ACS Symp. Ser. Aug. 13, 2009. 1023: 243-56.
Chaikovskii et al., Superactivity and Dual Reactivity of the System N-Iodosuccinimide-H2SO4 in the Iodination of Deactivated Arenes. Russian Journal of Organic Chemistry. 2007. 43(9): 1278-81.
Cheng et al., Synthesis of Conjugated Polymers for Organic Solar Cell Applications. Chem Rev. 2009. 109:5868-5923.
Cho et al., Polyfluorenes without Monoalkylfluorene Defects. J. Am. Chem. Soc. Sep. 7, 2007. 129: 11910-1. DOI: 10.1021/ja074634i.
Choi et al., Controlled Living Ring-Opening-Metathesis Polymerization by a Fast-Initiating Ruthenium Catalyst. Angew. Chem. In. Ed. Apr. 17, 2003. 42(15):1743-6. DOI: 10.1002/anie.200250632.
D'Alessandro et al., Liquid Crystal Devices for Photonic Switching Applications: State of the Art and Future Developments. Mol. Cryst.Liq.Cryst. 2003. 398: 207. DOI: 10.1080/15421400390221682.
Geary et al., The mechanism of polymer alignment of liquid-crystal materials. J. Appl. Phys. Nov. 15, 1987. 62(10): 4100-8.
Gelbart et al., A van der Waals Picture of the Isotropic-Nematic Liquid Crystal Phase Transition. Acc. Chem. Res. 1980. 13: 290-6.
Gu et al, Synthesis of fullerene-oligophenyleneethynylene hybrids. Tetrahedron Lett. 2001. 42:3175-8.
Gunes et al., Conjugated polymer-based organic solar cells. Chem Rev. Apr. 2007;107(4):1324-38.
Hafiz et al., Photoresponsive liquid crystal display driven by new photochromic azobenzene-based Langmuir-Blodgett films. Nanotechnology.Apr. 17, 2003. 14(6): 649.
Hoogboom et al. Increased Alignment of Electronic Polymers in Liquid Crystals via Hydrogen Bonding Extension. J. Am. Chem. Soc. 2006. 128: 15058-9.
Ichimura et al., Reversible Change in Alignment Mode of Nematic Liquid Crystals Regulated Photochemically by "Command Surfaces" Modified with an Azobenzene Monolayer. Langmuir. 1988. 4(5): 1214-6.
Iovu et al., Regioregular poly(3-alkylthiophene) conducting block copolymers. Polymer. 2005. 46: 8582-6. doi:10.1016/j.polymer.2005.05.035.
Iovu et al., Communications to the Editor. Macromolecules. Jul. 10, 2007. 40 (14):4733-5.
Kilbinger et al., Solution processable alternating oligothiophene-PEO-block-co-polymers: synthesis and evidence for solvent dependent aggregation. J. Mater. Chem. 2000. 10: 1777-84. DOI: 10.1039/B002899L.
Kim et al., Wide-angle, nonmechanical beam steering using thin liquid crystal polarization gratings. Proc SPIE. 2008. 7093: 709302. 12 pages.
Kraft et al., Electroluminescent Conjugated Polymers Ð Seeing Polymers in a New Light. Angew Chem. Int. Ed. 1998.37:402-28.
Larock et al., Palladium-catalysed Intermolecular Arylation and Alkenylation of Bicyclic Alkenes. J. Chem. Soc. Chem. Commun. 1989: 1368-70. DOI: 10.1039/C39890001368.
Lee et al., Hydrogenated Ring-Opened Polynorbornene: A Highly Crystalline Atactic Polymer. Macromolecules. 2005. 38(4): 1216-22. DOI: 10.1021/ma048013a.
Liu et al., Tuning the Electrical Conductivity and Self-Assembly of Regioregular Polythiophene by BlockCopolymerization : Nanowire Morphologies in New Di- and Triblock Copolymers. Angew Chem. Int. Ed. 2002. 4192: 329-32.
Lukáč et al., The formation of dibenzoyl peroxide by photooxidation of benzil in a polymer film. Macromol. Rapid Comm. Dec. 1994. 15(12):929-34. DOI: 10.1002/marc.1994.030151204.
McNeil et al., Conjugated polymers in an arene sandwich. J Am Chem Soc. Aug. 31, 2006. 128(38):12426-7. DOI: 10.1021/ja0648099.
McQuade et al., Conjugated Polymer-Based Chemical Sensors. Chem Rev. Jun. 9, 2000. 100(7): 2537-74.

(56) References Cited

OTHER PUBLICATIONS

Obi et al., Factors Affecting Photoalignment of Liquid Crystals Induced by Polymethacrylates with Coumarin Side Chains. Chem Mater. 1999. 11: 656-64.

Ohman, A New Monochromator. Nature. Feb. 12, 1938.157:291.

Poziomek et al., Use of Liquid Crystals as Vapor Detectors. Mol. Cryst. Liq. Cryst. 2003. 1973. 27:175-85.

Rahman et al., Aggregation of conjugated polymers in aromatic solvent. Langmuir. Feb. 3, 2009;25(3):1667-74.doi: 10.1021/la802526d.

Sapp et al., High Contrast Ratio and Fast-Switching Dual Polymer Electrochromic Devices. Chem Mater. 1998. 10(8):2101-8. DOI: 10.1021/cm9801237.

Schenck et al., Liquid crystal alignment on polymer line gratings. J. Appl. Phys. 2011. 109:064301. 5 pages.

Seo et al., Polar Anchoring Strength and the Temperature Dependence of Nematic Liquid Crystal (5CB) Aligned on Rubbed Polystyrene Films. Jpn. J. Appl Physics. Jul. 1992. 31(7): 2165-9.

Stasiek et al., Liquid crystal thermography and true-colour digital image processing. Optics & Laser Technology. 2006. 38: 243-56. doi:10.1016/j.optlastec.2005.06.028.

Swager,The Molecular Wire Approach to Sensory Signal Amplification. Acc. Chem. Res. 1998. 31: 201-207.

Tannaci et al., Stereoselective macrocyclization through zirconocene-mediated coupling of achiral dialkynes. Chem Commun (Camb). Jan. 8, 2009. 233-4. doi: 10.1039/b815750b. Epub Nov. 26, 2008.

Thompson et al., Polymer-fullerene composite solar cells. Angew Chem Int Ed Engl. 2008;47(1):58-77.

Trnka et al., The Development of $L_2X_2Ru=CHR$ Olefin Metathesis Catalysts: An Organometallic Success Story. Acc. Chem. Res. Nov. 4, 2001. 34(1): 18-29.

Weder et al., Efficient Solid-State Photoluminescence in New Poly(2,5-dialkoxy-p-phenyleneethynylene)s. Macromolecules. 1996. 29: 5157-65.

Yaroschuk et al., Liquid-crystal photo alignment using low-molecular-weight photo-cross-linkable composites. Appl Phys. Lett. Jul. 2, 2001. 79(1): 30-2.

Zhang et al., Liquid crystal alignment generated by linearly polarized UV light on photoactive low molecular mass compounds. Liq. Cryst. 2003.30(1):65-9.

Zhu et al., Conjugated Polymers Containing 2,3-Dialkoxybenzene and Iptycene Building Blocks. Org. Lett. Oct. 2, 2001. 3(22): 3471-4. DOI: 10.1021/o10164886.

Zimmerman et al., Unsymmetrical substitution and the direction of the di-.pi.-methane rearrangement. Mechanistic and exploratory organic photochemistry. LVI. J. Am. Chem. Soc. 1970. 92(21): 6259-67. DOI: 10.1021/ja00724a026.

Intramolecular Free Volume        No or Less Intramolecular
                                  Free Volume

PHOTOALIGNMENT OF MATERIALS INCLUDING LIQUID CRYSTALS

RELATED APPLICATIONS

This application claims priority under 35 U.S.C. §119(e) to U.S. Provisional Application Ser. No. 61/655,032, filed Jun. 4, 2012, the contents of which are incorporated herein by reference in its entirety for all purposes.

STATEMENT REGARDING FEDERALLY SPONSORED RESEARCH OR DEVELOPMENT

This invention was made with government support under Grant No. W911NF-07-D-0004 awarded by the Army Research Office. The government has certain rights in this invention.

FIELD OF THE INVENTION

Devices, compositions, and methods related to the alignment of materials including liquid crystals are provided.

BACKGROUND OF THE INVENTION

Liquid crystalline materials (LCMs) exhibit phases having some of the anisotropic properties of solids (orientational or positional order) yet are free flowing liquids. LCMs have been utilized in various applications including displays, thermometers, optical switches, wavelength tunable filters, lasing media, optical polarizers, and sensing materials. Many devices incorporate materials exhibiting a nematic liquid crystal phase, where molecules possess orientational order but lack any positional order. When nematic phases are formed on isotropic substrates, such as glass, many nematic domains form where the vectors that describe the orientational order (director) vary in direction across the mesophase. (FIG. 1) However, typically, devices that utilize liquid crystalline phases require substantially uniform alignment of the liquid crystal phase, as shown in FIG. 1.

In order to induce alignment, a technique known as rubbing was developed involving a thin polymer film rubbed in one direction using a cloth to generate microscopic and molecular anisotropies on the surface of the substrate. Rubbing is a major industrial technique for producing aligned LCMs. However, there are a number of problems associated with the rubbing process such as: (i) generation of static charges in the device, (ii) incorporation of dust particles or other impurities on the surface, (iii) the inability to create patterns, and (iv) it can serve as a bottleneck in the production of LCMs.

In order to solve the problems with rubbing, there has been considerable interest in developing non-contact alignment processes that utilize light to align liquid crystals (e.g., photoalignment). The general approach is to coat a substrate with a photoresponsive polymeric film, and through polarized irradiation, generate anisotropy at the liquid crystal-polymer interface. The photoresponsive polymer films typically rely on simple photochemical transformations such as cis/trans isomerizations and cycloaddition reactions. Some commonly used transformations for photoalignment include cis-trans isomerizations of olefins, fragmentation reactions (e.g., of polymers or dimers into monomers), cycloadditions (e.g., [2+2] cycloadditions). However, such reactions generally suffer from at least one of the following limitations: (i) the transformation is thermally reversible, (ii) more than one pathway is available, (iii) the process is inefficient, (iv) the process promotes only weak alignment forces on the liquid crystal, and/or (v) extended irradiation destroys the alignment.

SUMMARY OF THE INVENTION

Compositions, materials, devices, and methods for alignment of materials are provided. Some embodiments provide a polymer comprising a photoreactive species comprising an $sp^3$-hybridized carbon covalently bonded to at least two carbon-carbon double bond groups, wherein the photoreactive species is able to undergo a di-pi-methane rearrangement upon exposure to electromagnetic radiation.

In some embodiments, a device is provided comprising an anisotropic material; and a photoreactive material in contact with the anisotropic material, the photoreactive material comprising a species comprising an $sp^3$-hybridized carbon covalently bonded to at least two carbon-carbon double bond groups, wherein the species undergoes a di-pi-methane rearrangement upon exposure to electromagnetic radiation.

In some embodiments, a polymer is provided comprising a group having the following structure,

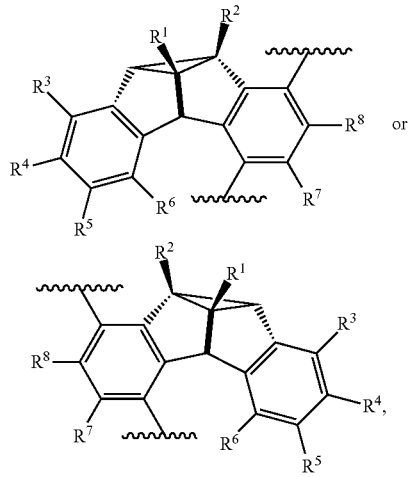

wherein:
$R^1$ and $R^2$ can be the same or different and are hydrogen, alkyl, aryl, heteroalkyl, heteroaryl, a carbonyl group, halo, hydroxyl, amino, nitro, cyano, any of which is optionally substituted, or, $R^1$ and $R^2$ are joined together to form an optionally substituted ring; and $R^{3-8}$ can be the same or different and are hydrogen, alkyl, aryl, heteroalkyl, heteroaryl, a carbonyl group, halo, hydroxyl, amino, nitro, cyano, any of which is optionally substituted.

In some embodiments, a device is provided comprising an anisotropic material; and an alignment material comprising a photoproduct of a di-pi-methane rearrangement in physical contact with the anisotropic material.

In some embodiments, a method is provided comprising providing a polymer comprising a photoreactive species comprising an $sp^3$-hybridized carbon covalently bonded to at least two carbon-carbon double bond groups; and exposing the polymer to electromagnetic radiation under conditions sufficient to promote a di-pi-methane rearrangement, thereby forming a photoproduct.

In some embodiments, a method for alignment of an anisotropic material is provided comprising exposing a material comprising a photoreactive species to electromagnetic radiation to produce a photoproduct via a di-pi-methane rearrangement of the photoreactive species; and arranging an anisotropic material in contact with the material.

In some embodiments, a method for crystal growth is provided comprising exposing a material comprising a photoreactive species to electromagnetic radiation to produce a photoproduct via a di-pi-methane rearrangement of the photoreactive species; and arranging a crystal precursor in contact with the material.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Embodiments described herein generally relate to compositions, devices, and methods involving the alignment of certain materials, such as anisotropic materials (e.g., liquid crystals, polymers, nanoparticles, etc.). For example, a photoresponsive material may be used as an alignment surface for a liquid crystal phase, or to accelerate and/or enhance switching/orientation events in devices. Methods described herein may provide chemically and/or thermally stable alignment materials for use in a various technologies, including transistors, luminescent devices, optical polarizers, and liquid crystal devices.

Materials, devices, and methods described herein may be advantageous in that non-contact methods can be utilized to produce alignment surfaces for liquid crystals, polymers, other anisotropic materials or materials that can be aligned/oriented upon contact with an alignment surface. For example, a device as described herein can include a material capable of undergoing a photoreaction to produce a photoproduct that can aid in the alignment of materials. In some cases, the photoproduct can be relatively stable to subsequent thermal treatment. That is, the photoproduct may not undergo change in chemical structure upon subsequent thermal treatment, or, the photoproduct may undergo change in chemical structure but does not revert back to the chemical structure(s) of the starting material(s) present prior to the photoreaction. In other cases, the photoproduct displays different thermal reactivity from the initial starting material. The combination of photochemical treatment (e.g., to cause a di-pi-methane rearrangement) and thermal treatment may, in some cases, produce improved alignment properties. Additionally, embodiments described herein may provide materials which are readily synthesized and easily modified to suit a wide range of applications. As used herein, a "photoproduct" is given its ordinary meaning in the art and refers to a species formed as a result of a photochemical reaction.

Figure 1:
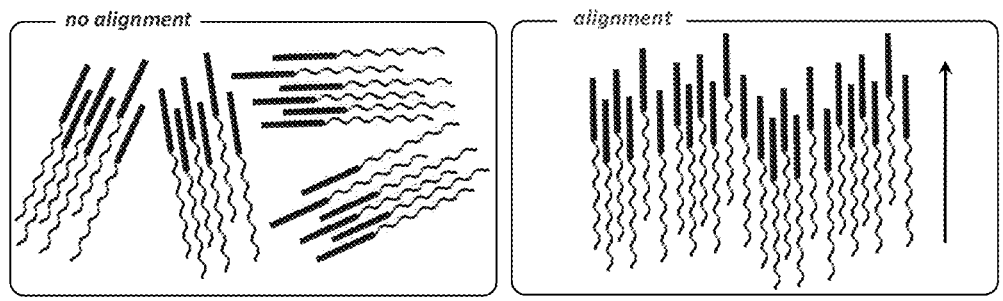
FIG. 1 shows schematic depictions of unaligned and aligned nematic liquid crystalline phases, where the rod-like structure represents a liquid crystal mesogen such as 5CB and the black arrow represents the molecular director.
Figure 2A:
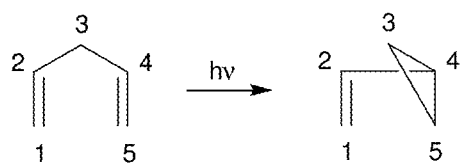
FIG. 2 shows (a) a general di-pi-methane rearrangement; (b) the radical mechanism of a di-pi-methane rearrangement; and (c) di-pi-methane rearrangement of a compound via indirect triplet excitation and direct singlet excitation.

Some embodiments described herein provide materials (e.g., polymers, small molecules, etc.) which include a moiety capable of undergoing a di-pi-methane rearrangement (e.g., a photoreactive species) and/or a photoproduct of a di-pi-methane rearrangement. As used herein, the term "di-pi-methane rearrangement" is given its ordinary meaning in the art and refers to a photochemical reaction of a species which includes two pi-bond containing groups separated by one saturated carbon atom to form a substituted cyclopropane moiety. FIG. 2A illustrates the overall transformation, generally involving converting a 1,4-diene system to an allylic cyclopropane moiety. In some cases, the photoreactive species comprises an $sp^3$-hybridized carbon covalently bonded to at least two carbon-carbon double bond groups. Examples of species which can undergo di-pi-methane rearrangements include 1,4-dienes, aryl groups substituted with an allyl group, barrelenes, iptycenes, substituted derivatives thereof, and the like. Other examples of species which can undergo di-pi-methane rearrangements are described in Hixson et al., Chem. Rev. 1973, 73(5), 531, the contents of which are incorporated herein by reference in its entirety for all purposes. The di-pi-methane rearrangement may proceed via a singlet excited state or a triplet excited state, as described more fully herein. In some cases, materials described herein may be used as a surface for inducing or directing alignment when contacted with an anisotropic material (e.g., a liquid crystal, a polymer).

Methods are also provided involving exposing a material (e.g., polymer) that includes a photoreactive species as described herein to electromagnetic radiation under conditions sufficient to promote a di-pi-methane rearrangement to form a photoproduct. In some cases, the material may be exposed to electromagnetic radiation at a wavelength capable of directly exciting a photoreactive species present within the material. In some cases, the material may be exposed to electromagnetic radiation at a wavelength capable of directly exciting a different species present within the material, such as a sensitizer group, as described more fully herein. The photoproduct may be capable of affecting the alignment and/or orientation of a material when placed in contact with the photoproduct. For example, the photoproduct may exhibit a change in a physical characteristic relative to its corresponding starting material that causes a change in the alignment and/or orientation of a material in contact with the photoproduct. In some embodiments, the photoproduct may have a different alignment, orientation, and/or position than that of the photoreactive species starting material. For example, upon formation of the photoproduct via the di-pi-methane rearrangement, the polymer may undergo a change in direction or orientation, where the change may not be readily reversed through, for example, conformational changes of the polymer. That is, the polymer may not readily "relax" to its initial alignment, orientation, and/or position. In another set of embodiments, the photoproduct may cause the polymer to exhibit a more rigid and/or more elongated structure relative to that of the photoreactive species starting material. In another set of embodiments, the photoproduct can display a different thermal reactivity from the initial starting material, and thermal treatment after photochemical modification (e.g., via di-pi-methane rearrangement) may produce enhanced alignment properties.

Figure 5:
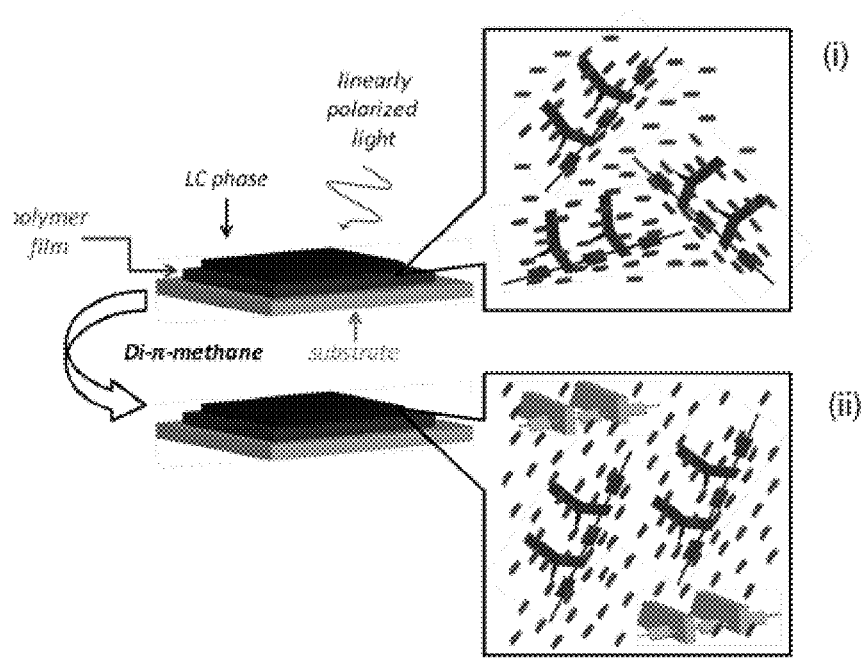
FIG. 5 shows (i) a photoalignment polymer containing a di-pi-methane rearrangement substrate and having intramolecular free volume combined with a liquid crystal; and (ii) a photoalignment polymer containing a di-pi-methane rearrangement product and having decreased intramolecular free volume combined with a liquid crystal.

In one set of embodiments, the photoproduct may have an intramolecular free volume that is changed (e.g., reduced) when compared to the intramolecular free volume of the photoreactive species starting material (e.g., prior to di-pi-methane rearrangement). The "internal free volume," "intramolecular free volume," or "free volume" of a molecule is defined as the volume in space taken up by a molecule, where boundaries defining the internal free volume span all projections or protrusions of the molecule. Examples of molecules having intramolecular free volume are described, for example, in U.S. Pat. Nos. 6,783,814 and 7,208,122, the contents of which are incorporated herein by reference in its entirety for all purposes. In some embodiments, a photoresponsive species may include a three-dimensional structure (e.g., a barrelene, iptycene, triptycene, etc.) having a sufficient degree of intramolecular free volume to create void spaces that are favored to be filled by a matrix material (e.g., an anisotropic material), and/or can facilitate alignment of an anisotropic material (e.g., a liquid crystal) in a first orientation. That is, when mixed with an anisotropic material, the anisotropic material may fill in the void spaces of the photoresponsive species and align along a first orientation. Other species, including small molecules, macromolecules, polymers, etc., may also occupy the void spaces. FIG. 5(i) shows an illustrative embodiment where a photoresponsive species having intramolecular free volume is combined with a liquid crystal that occupies the void spaces of the photoresponsive species. Upon exposure to electromagnetic radiation, the photoresponsive species may undergo a photochemical reaction (e.g., a di-pi-methane rearrangement) to produce a photoproduct having a relatively decreased degree of intramolecular free volume, causing at least a portion of the anisotropic material to adopt a second, different orientation, as shown in FIG. 5(ii). In another set of embodiments, the photoproduct may have an increased degree of intramolecular free volume, relative to the photoreactive species starting material.

Such methods and materials may be useful in the alignment of certain materials, such as anisotropic materials (e.g., liquid crystals, polymers, nanoparticles, etc.). For example, a material including a photoreactive species as described herein may be exposed to electromagnetic radiation to produce a photoproduct, which can be arranged in contact with an anisotropic material such as a liquid crystal. In some cases, the liquid crystal is a nematic liquid crystal. The material containing the photoproduct may be used to generate, stabilize and/or accelerate alignment of one or more liquid crystal phases. In some embodiments, a polymer as described herein may serve as an alignment tool to position at least a portion of a liquid crystal in a desired orientation, tilt angle, or mesophase, in some cases, without need for an external source of energy.

Another advantage provided by embodiments described herein may be the ability to accelerate and/or enhance the switching or alignment events in devices, such as liquid crystal devices. For example, a device may include a liquid crystal in an initial orientation in contact with an alignment material as described herein. Upon application of an external source of energy (e.g., electric field), the liquid crystal may be switched from the initial orientation to a different orientation. Upon removal of the external source of energy, the liquid crystal may return to and maintain its initial orientation due to the presence of the alignment material. In some cases, the liquid crystal may return to its initial orientation more rapidly in devices containing alignment materials as described herein, relative to essentially identical devices lacking the alignment materials as described herein, under essentially identical conditions. In other examples the alignment material may direct assembly of another material such as a dye-containing liquid crystal or a conjugated polymer.

In another set of embodiments, methods for directing the growth of crystals are provided. The method may involve exposing a material comprising a photoreactive species as described herein to electromagnetic radiation to produce a photoproduct (e.g., via a di-pi-methane rearrangement of the photoreactive species). The photoproduct may be arranged in contact with a crystal precursor (e.g., crystal precursor solution, crystal precursor vapor), such that formation of the crystal is directed by the orientation, position, and/or other directional characteristic provided by the material containing the photoproduct.

In some cases, the method may involve additional treatment of the material upon occurrence of a di-pi-methane rearrangement. For example, the method may include subjecting the photoproduct to thermal treatment during and/or after di-pi-methane rearrangement. In some cases, thermal treatment of the photoproduct does not result in a change in the chemical structure of the photoproduct, but otherwise stabilizes or improves the performance of the material. In other cases, thermal treatment of the photoproduct results in a change in the chemical structure of the photoproduct. For example, thermal treatment may cause subsequent rearrangement or reaction of the photoproduct, such as a retro Diels-Alder reaction, or other reorganization of the strained cyclic structures produced by the di-π-methane rearrangement.

In some embodiments, the method includes a crosslinking step. For example, bonds between adjacent photoproducts may be formed, during and/or after occurrence of the di-pi-methane rearrangement. In some cases, bonds may be formed between the photoproduct and a substrate in contact with the photoproduct. The substrate may comprise, for example, a polymer, glass, a metal (e.g., gold, silicon, silver, etc.), a ceramic, or other materials. The crosslinking step may be performed by exposing the photoproduct to electromagnetic radiation, a chemical reagent, by thermal treatment, or other methods known to those of skill in the art. In some cases, formation of the crosslinking bonds may occur via a radical mechanism.

In some cases, a material including a photoreactive species is provided, where at least a portion of the material is capable of undergoing a di-pi-methane rearrangement upon exposure to electromagnetic radiation, and/or contains a photoproduct of a di-pi-methane rearrangement. For example, the material may include a polymer containing the photoreactive species. In some cases, the photoactive species may be suspended within, dispersed throughout, or otherwise contained in a polymer matrix. In some cases, the photoactive species may be a part of (e.g., attached to) the polymer backbone. In some cases, the photoactive species may be a group that is pendant to the polymer backbone. In some cases, the photoreactive species may be attached to the polymer backbone such that the photoreactive species is substantially rigidly fixed in a specific direction, and substantially unable to change its orientation, with respect to the polymer backbone. For example, the photoreactive species may be attached to the polymer backbone via two bonds such that it is substantially unable to change its orientation with respect to the polymer backbone. In some embodiments, the polymer has a polymer backbone that exhibits a glass transition temperature above room temperature.

In some embodiments, the polymer is a conjugated polymer. For example, the polymer may include a pi-conjugated polymer backbone or a sigma-conjugated polymer backbone. Examples of such polymers include poly(arylene)s, poly(arylene vinylene)s, poly(arylene ethynylene)s, and the like. In some cases, the polymer is a non-conjugated polymer. Examples of such polymers include polyethers, polycarbonates, polyacrylates (e.g., polymethylmethacrylate), polystyrenes, polyurethanes, and the like. For example, the polymer may include optionally substituted barrelene units separated by alkyl groups within the polymer backbone. In other cases, the polymer may include triptycene units separated by alkyl groups within the polymer backbone.

The photoreactive species may be associated with the polymer in a manner such that reaction via a di-pi-methane rearrangement produces a photoproduct capable of affecting the alignment or orientation of another material in contact with the photoproduct. For example, the photoreactive species may be covalently bonded to the polymer such that sufficient conformational changes in the polymer can occur upon photoreaction to affect the alignment of an anisotropic material contacting the polymer. In some embodiments, the photoactive species may be attached to the polymer via at least one covalent bond. In some embodiments, the photoactive species is attached to the polymer via one covalent bond. In some embodiments, the photoactive species is attached to the polymer via two covalent bonds (e.g., via two atoms of photoactive species).

In some embodiments, the photoreactive species may be associated with the polymer via at least one non-covalent bond, including an ionic bond, a hydrogen bond (e.g., between hydroxyl, amine, carboxyl, thiol and/or similar functional groups, for example), a dative bond (e.g. complexation or chelation between metal ions and monodentate or multidentate ligands), or the like. In some embodiments, the photoreactive species may be associated with the polymer via Van der Waals interactions. The photoreactive species may also be associated with the polymer via a binding event between pairs of biological molecules. In an illustrative embodiment, the photoreactive species may be a small molecules that is substantially contained within and/or dispersed throughout the polymer.

Figure 2B:
Figure 2C:
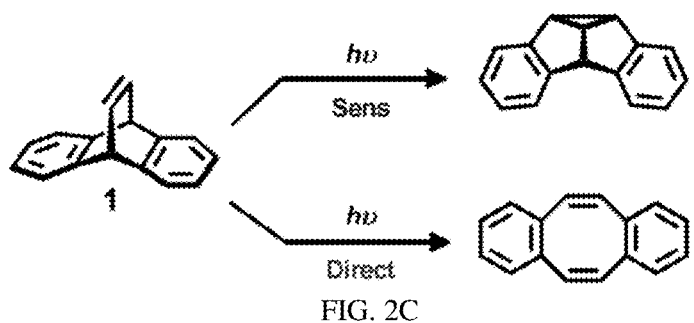

In some cases, the di-pi-methane rearrangement may proceed via an excited singlet state. For example, FIG. 2B shows a compound with unconstrained, freely rotating, divinyl groups which reacts via an excited singlet state yields the di-pi-methane rearrangement product. However, if the same substrate is reacted through a triplet excited state, the only observed products are the result of isomerization about the double bonds. In some cases, the di-pi-methane rearrangement may proceed via an excited triplet state. For example, a compound with constrained divinyl moieties, as shown by Compound 1 in FIG. 2C, can be reacted via an excited triplet state to yield a di-pi-methane rearrangement product whereas direct irradiation of the same compound yields dibenzocyclooctatetraene.

Some embodiments may involve use of a sensitizer group. The sensitizer group may be any group capable of facilitating or enhancing a photochemical reaction. In some embodiments, the sensitizer may include a carbonyl group. In some embodiments, the sensitizer may include a group having pi conjugation. For example, the sensitizer group may be directly excited to a singlet excited state and may undergo interstitial crossing to produce a triplet excited state. In some cases, energy transfer between the sensitizer group and a photoreactive species may facilitate the photochemical reaction. For example, the sensitizer group may be directly excited and energy transfer from the sensitizer group to the photoreactive species may facilitate the photochemical reaction. In other examples, energy transfer from the photoreactive species to the sensitizer group may facilitate the photochemical reaction. In some embodiments, the sensitizer group is capable of facilitating a di-pi-methane rearrangement (e.g., via a singlet excited state, via a triplet excited state). Examples of sensitizer groups include carbonyl-containing groups, such as an acetone moiety, a benzophenone moiety, or the like. In some cases, an atom having a relatively high atomic number (e.g., iodine or bromine) may serve as a sensitizer group, for example, via a heavy atom effect.

The sensitizer group may be associated with the polymer and/or photoreactive species via at least one bond, including covalent and/or non-covalent bonds described herein, or other interactions such as binding or van der Waals interactions. In some embodiments, the sensitizer group is attached to the polymer via a covalent bond. In some embodiments, the sensitizer group is attached to the polymer via two covalent bonds (e.g., via two atoms of sensitizer group). In some cases, the sensitizer group may be a group that is pendant to the polymer backbone. In some cases, the sensitizer group may be a part of the polymer backbone.

In some embodiments, at least one of the photoreactive species and the sensitizer group may be attached to the polymer via a covalent bond. For example, the photoreactive species may be attached to the polymer via one or more covalent bonds and the sensitizer group may be substantially contained within or dispersed throughout the polymer. In another example, the sensitizer group may be attached to the polymer via a covalent bond and the photoreactive species may be substantially contained within or dispersed throughout the polymer. In some embodiments, the polymer may include both a photoreactive species and a sensitizer group attached to one another via at least one covalent bond. For example, the polymer may include a photoreactive species monomer and a sensitizer group monomer.

In one set of embodiments, the photoreactive species may include an optionally substituted barrelene structure. In some cases, the polymer may be a conjugated polymer including an optionally substituted barrelene structure. In some cases, the polymer may be a non-conjugated polymer including an optionally substituted barrelene structure. As an example, the polymer may include a photoreactive species having the following structure:

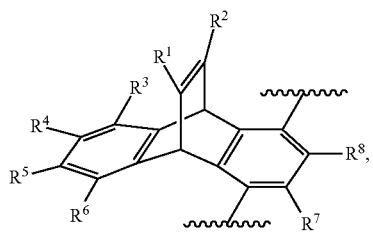

wherein $R^1$ and $R^2$ can be the same or different and are hydrogen, alkyl, aryl, heteroalkyl, heteroaryl, a carbonyl group, halo, hydroxyl, amino, nitro, cyano, any of which is optionally substituted, or, $R^1$ and $R^2$ are joined together to form an optionally substituted ring; and
$R^{3-8}$ can be the same or different and are hydrogen, alkyl, aryl, heteroalkyl, heteroaryl, a carbonyl group, halo, hydroxyl, amino, nitro, cyano, any of which is optionally substituted.

In some cases, $R^1$ and $R^2$ can be the same or different and are hydrogen, alkyl, aryl, or a carbonyl group, any of which is optionally substituted, or, $R^1$ and $R^2$ are joined together to form an optionally substituted ring; and $R^{3-8}$ can be the same or different and are hydrogen, alkyl, aryl, or a carbonyl group, any of which is optionally substituted. In some embodiments, at least one of $R^1$ and $R^2$ is a carbonyl group. In some embodiments, at least one of $R^1$ and $R^2$ is a ketone, ester, aldehyde, or amide group. In one set of embodiments, both $R^1$ and $R^2$ are esters (e.g. methyl esters). In another set of embodiments, $R^1$ and $R^2$ are joined together to form an optionally substituted ring (e.g., a phenyl ring). For example, $R^1$ and $R^2$ may be joined together to form a phenyl ring, producing an triptycene structure.

In some embodiments, the polymer may have the following structure,

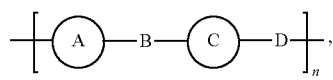

wherein A is an aromatic group and comprises the photoreactive species; C is a sensitizer group; B and D can be the same or different and are absent, optionally substituted carbon-carbon double bonds, or carbon-carbon triple bonds; and n is greater than 1.

In some embodiments, A is an optionally substituted barrelene group, such as those described herein.

In some embodiments, $R^{3-8}$ are hydrogen.

In some embodiments, B and D are carbon-carbon double bonds.

In some embodiments, B and D are carbon-carbon triple bonds.

In some embodiments, the polymer comprises the structure:

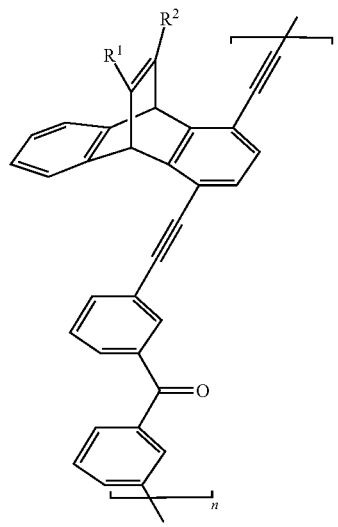

or

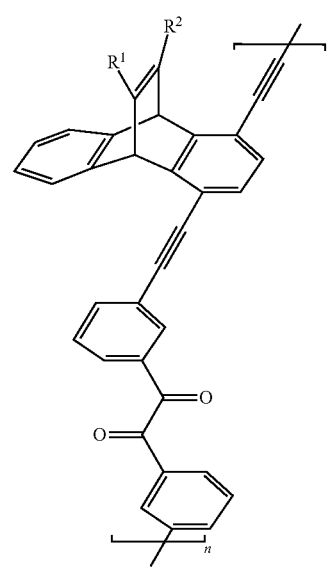

wherein:
$R^1$ and $R^2$ can be the same or different and are hydrogen, alkyl, aryl, heteroalkyl, heteroaryl, a carbonyl group, halo, hydroxyl, amino, nitro, cyano, any of which is optionally substituted, or, $R^1$ and $R^2$ are joined together to form an optionally substituted ring; and n is greater than 1.

In some cases, at least one of $R^1$ and $R^2$ is a carbonyl group, such as a ketone, ester (e.g., methyl ester), aldehyde, or amide group. In some cases, $R^1$ and $R^2$ are both esters. In other cases, $R^1$ and $R^2$ are joined together to form an optionally substituted ring.

In one set of embodiments, the polymer includes the structure,

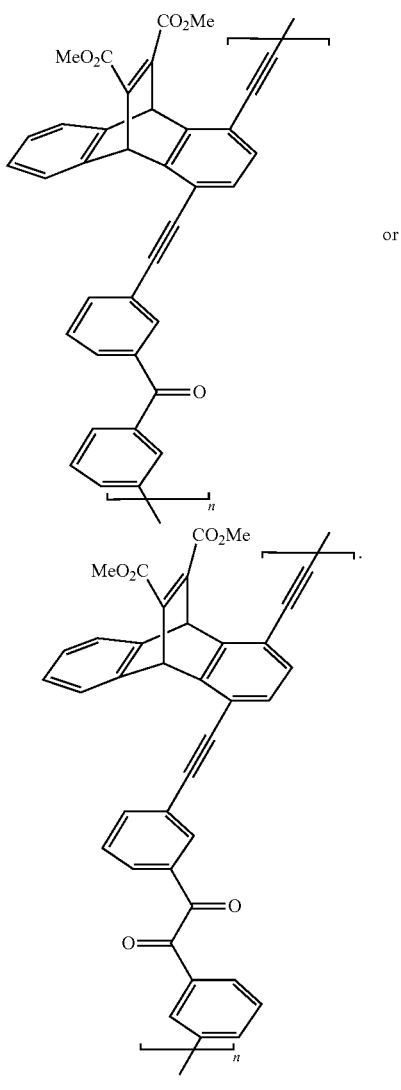

or

In any of the embodiments described herein, n may be greater than 1, greater than 10, greater than 100, greater than 1000, greater than 10,000, greater than 100,000, greater than 1,000,000, or greater. In some embodiments, n is between about 2 and about 10, between about 2 and about 100, between about 2 and about 1000, between about 2 and about 10,000, between about 2 and about 100,000, between about 2 and about 1,000,000. Those of ordinary skill in the art would be able to tailor the polymerization reaction to produce a polymer having a particular desired length or molecular weight.

Materials described herein may also include a photoproduct of a di-pi-methane rearrangement. In some cases, the photoproduct may exhibit an intramolecular free volume that is lower than that of its corresponding starting material prior to the a di-pi-methane rearrangement. It should be understood that photoproducts of the di-pi-methane rearrangement can also be associated with the polymer via any of the bonds or interactions disclosed herein. For example, the photoproduct may be covalently or non-covalently associated with a polymer, as described herein. In some cases, the photoproduct may exhibit an intramolecular free volume that is higher than that of its corresponding starting material prior to the a di-pi-methane rearrangement. Those of ordinary skill in the art would understand that the liquid crystals, polymers, or other materials in contact with the alignment material may organize in a way that minimizes the free volume at the regions of contact between the materials. As a result, the photochemical and/or thermal treatment of alignment materials can create directional order and/or may facilitate alignment of a liquid crystal, polymer, or other material at the interface between the alignment material and the liquid crystal, polymer, or other material, to minimize free volume.

In some cases, materials (e.g., polymers, small molecules) are provided which include a group having the following structure, wherein:

$R^1$ and $R^2$ can be the same or different and are hydrogen, alkyl, aryl, heteroalkyl, heteroaryl, a carbonyl group, halo, hydroxyl, amino, nitro, cyano, any of which is optionally substituted, or, $R^1$ and $R^2$ are joined together to form an optionally substituted ring; and $R^{3-8}$ can be the same or different and are hydrogen, alkyl, aryl, heteroalkyl, heteroaryl, a carbonyl group, halo, hydroxyl, amino, nitro, cyano, any of which is optionally substituted.

In some embodiments, $R^1$ and $R^2$ can be the same or different and are hydrogen, alkyl, aryl, or a carbonyl group, any of which is optionally substituted, or, $R^1$ and $R^2$ are joined together to form an optionally substituted ring; and $R^{3-8}$ can be the same or different and are hydrogen, alkyl, aryl, or a carbonyl group, any of which is optionally substituted.

In some embodiments, at least one of $R^1$ and $R^2$ is a carbonyl group. For example, $R^1$ and/or $R^2$ may be a ketone, ester, aldehyde, or amide group. In some embodiments, $R^1$ and $R^2$ are esters, such as methyl esters.

In some embodiments, $R^1$ and $R^2$ are joined together to form an optionally substituted ring.

In some embodiments, $R^{3-8}$ are hydrogen.

In one set of embodiments, the polymer has the following structure,

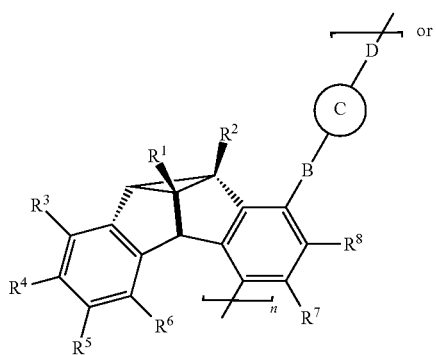

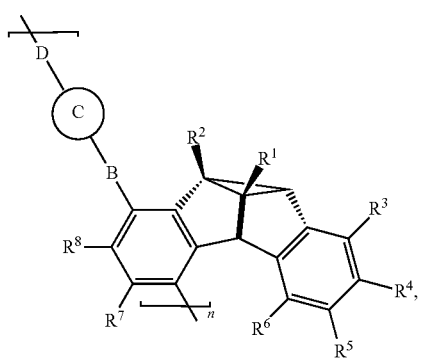

wherein C is a sensitizer group; B and D can be the same or different and are absent, optionally substituted carbon-carbon double bonds, or carbon-carbon triple bonds; and n is greater than 1.

In some cases, the sensitizer group includes at least one carbonyl. For example, the sensitizer group includes a ketone (e.g., a benzophenone group).

In some embodiments, B and D are carbon-carbon double bonds.

In some embodiments, B and D are carbon-carbon triple bonds.

In some embodiments, the polymer includes the structure:

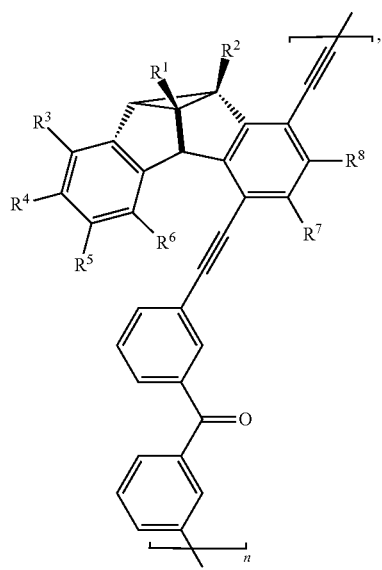

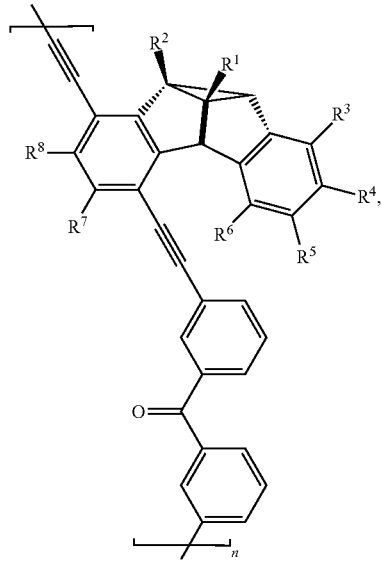

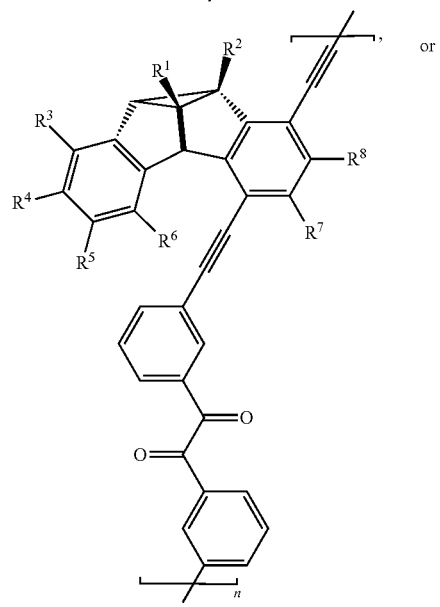

-continued

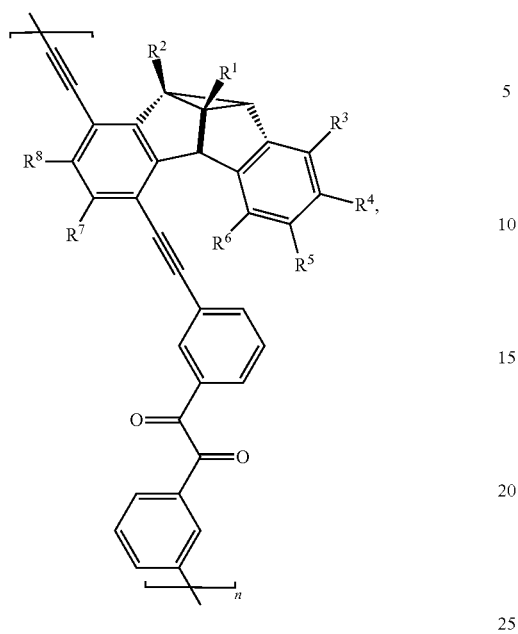

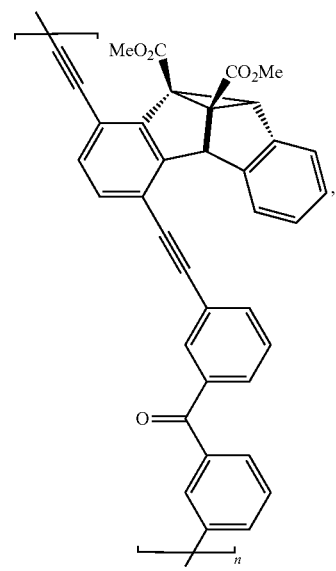

wherein $R^1$ and $R^2$ can be the same or different and are hydrogen, alkyl, aryl, heteroalkyl, heteroaryl, a carbonyl group, halo, hydroxyl, amino, nitro, cyano, any of which is optionally substituted, or, $R^1$ and $R^2$ joined together to form an optionally substituted ring; and n is greater than 1.

In some embodiments, at least on of $R^1$ and $R^2$ is a carbonyl group, such as a ketone, ester, aldehyde, or amide group. In some embodiments, $R^1$ and $R^2$ are esters.

In some embodiments, $R^1$ and $R^2$ are joined together to form an optionally substituted ring (e.g., a phenyl ring).

In some embodiments, $R^{3-8}$ are hydrogen.

In some embodiments, the polymer includes the structure:

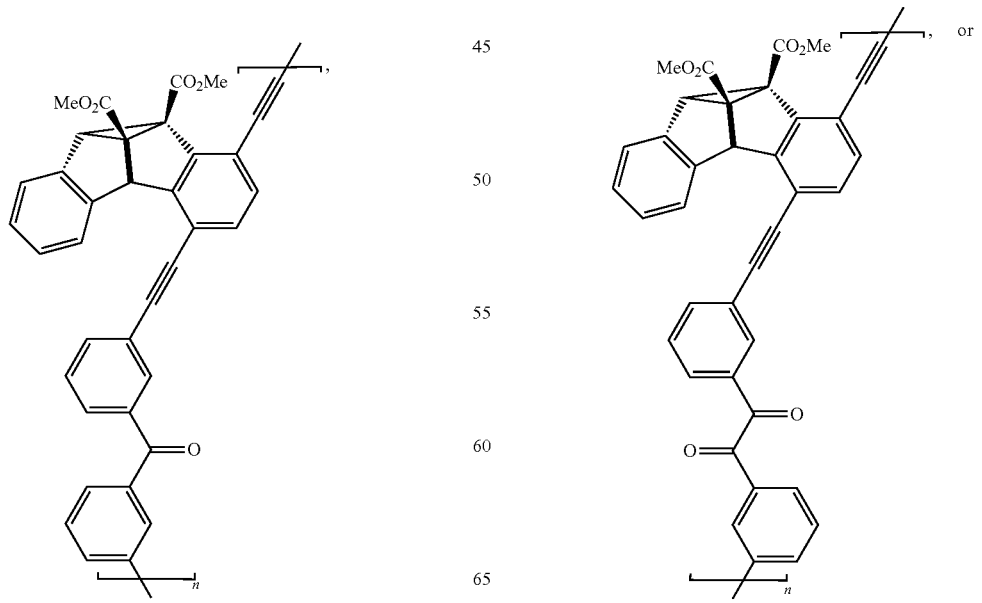

-continued

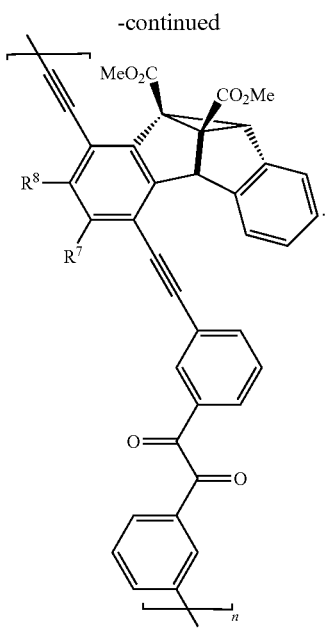

In other embodiments, the photoreactive species, photoproduct, and/or sensitizer group may be small molecules associated with one another via non-covalent interactions. The association may be such that the components are in sufficient proximity to one another such that energy transfer between the components can occur. For example, a small molecule photoreactive species and a small molecule sensitizer group may be substantially contained within or dispersed throughout a support material (e.g., a polymer matrix).

Figure 3A:
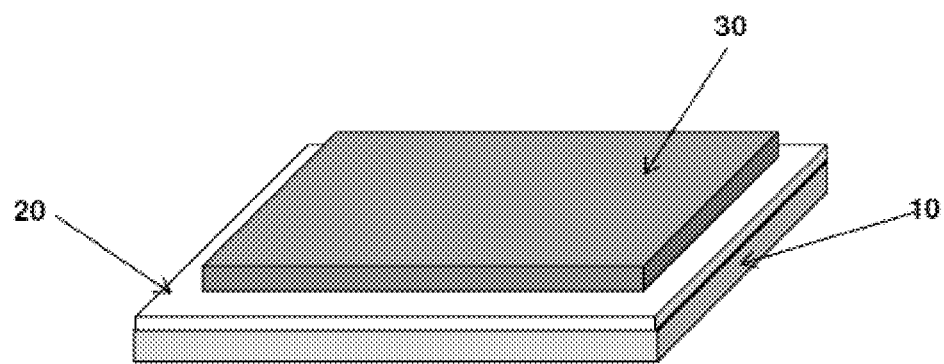
FIG. 3 shows (a) an illustrative device assembly including photoalignment polymers as described herein; and (b) assembly of a device including photoalignment polymers.

Devices including the materials described herein are also provided. For example, a device can include a photoreactive species and/or photoproduct in contact with a material to be aligned/oriented (e.g., an anisotropic material). FIG. 3A shows an illustrative embodiment, where alignment material 20 (e.g., including a photoresponsive material and/or photoproduct as described herein) is formed on substrate 10 and is placed in contact with anisotropic material 30. In some cases, the device may comprise additional components capable of orienting a material in one or more orientations. In some cases, the device may comprise at least one alignment surface in contact with at least a portion of material, wherein the alignment surface is capable of orienting the material. The alignment surface may include a photoreactive species and/or photoproduct as described herein. In some cases, one or more alignment surfaces may contact the material at different locations. For example, a liquid crystal may be placed between a first alignment surface positioned in a first direction and a second alignment surface oriented in a second direction, wherein the first and second alignment surfaces are positioned such that their directions are non-parallel or essentially perpendicular (e.g., approximately 90°) with respect to one another. This may result in the formation of a twisted nematic phase, wherein the liquid crystal director rotates approximately 90° from the first alignment surface to the second alignment surface.

In some cases, alignment surfaces as described herein may be used in combination with other alignment materials known in the art, examples of which can be found in, for example, *Thermotropic Liquid Crystals*, G. W. Gray, Ed., John Wiley & Sons, 1987, and a review by J. Cognard, Mol. Cryst. Liq. Cryst. 78, Supplement 1 (1981), pages 1-77.

The devices may further comprise electrodes, polarizing filters, sources of external energy, and the like, in combination with the components described herein.

Figure 3B:
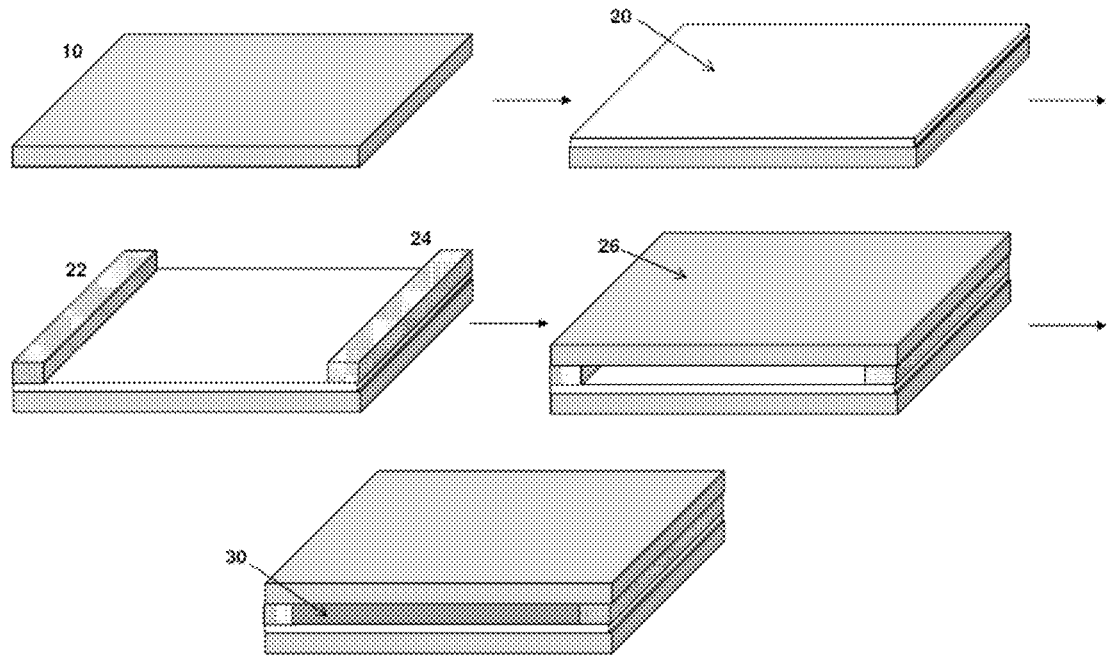

Devices described herein may be fabricated using various methods. As an illustrative embodiment, FIG. 3B shows fabrication of a device for alignment of an anisotropic material. Alignment material 20 includes a photoresponsive material and/or photoproduct as described herein, and is formed on substrate 10. Spacers 22 and 24 are arranged on the surface of alignment material 20, and a second substrate 26 and is arranged on spaces 22 and 24. Anisotropic material 30 may then be introduced in the gap between substrate 10 and substrate 26. In some embodiments, alignment material 20 may affect the orientation of anisotropic material 30. In some embodiments, substrate 26 may optionally include an additional alignment material that contacts, and affects the alignment/orientation of, anisotropic material 30.

Methods for orienting and/or aligning a material are also provided. The method may comprise contacting a polymer as described herein with a material capable of being aligned or oriented when in contact with an alignment material. In some cases, the material is an anisotropic material such as a liquid crystal. The material may comprise polymers (e.g., homopolymers, copolymers, block polymers, blends of polymers, polymeric materials combined with additives such as dyes, inorganic nanoparticles, liquid crystals, and the like), nanoparticles, liquid crystals, other materials capable of alignment, or combinations thereof. In some cases, the material is a nematic liquid crystal. Those of ordinary skill in the art will be able to select, based upon the teaching of this disclosure, suitable materials to be aligned/oriented using the materials, devices and methods described herein. Screening tests for the selection of such materials can include, for example, placing the material in contact with an alignment surface and determining whether at least certain portions of the material can align, self-assemble, or otherwise be oriented by the alignment surface. Determining techniques can include optical microscopy, X-ray diffraction, electron microscopy, and other techniques well-known to those of ordinary skill in the art.

As described herein, a photoreactive species may be used to produce various alignment. Those of ordinary skill in the art would be able to select the appropriate photoreactive species for use in a particular application. For example, a photoreactive species capable of undergoing a di-pi-methane rearrangement may be selected. Examples of such species, as well as their synthesis, are disclosed in Hixson et al., Chem. Rev. 1973, 73(5), 531, the contents of which are incorporated herein by reference in its entirety for all purposes. Simple screening tests may be used to evaluate whether or not a particular photoreactive species is suitable for use in a desired application. For example, a small molecule, model compound including the photoreactive species may be purchased or synthesized and may be combined with an anisotropic material (e.g., a liquid crystal) to form a sample. Electromagnetic radiation may be applied to the sample, and the properties of the resulting material may be observed to determine whether or not the photoreactive species affects the alignment of the anisotropic material.

The alignment materials (e.g., small molecules, polymers, etc.) may be appropriately functionalized to impart desired characteristics to the material. For example, the material may be functionalized or derivatized to include compounds, functional groups, atoms, or other species that can alter or improve properties of the material. In some embodiments, the material may include compounds, atoms, etc., that can alter or improve properties such as compatibility (e.g., solubility, stability) with a matrix or support material. In some cases, the material may comprise functional groups selected to possess an affinity for a surface. Other properties of the materials may be tailored based on substitution of, for example, a polymer backbone, such as a particular band gap or a specific emission wavelength or color emission. For example, optical properties (e.g., absorption, emission) of a material may be tailored by substituting the material with electron-poor groups or electron rich groups. In some cases, electron-poor groups, such as acyl, carboxyl, cyano, nitro, sulfonate, or the like, may be incorporated to shift absorption and/or emission of a material to shorter wavelengths. In other embodiments, a material may be substituted with electron-rich groups, such as amino, hydroxy, alkoxy, acylamino, acyloxy, alkyl, halide, and the like, such that the material exhibits an absorption and/or emission at longer wavelengths. The selection of appropriate functional groups on a material may allow one to design various components having overlapping absorption/emission spectra, allowing the components to be capable of energy transfer.

Compounds, oligomers, polymers, and other materials described herein may be synthesized by a variety of methods as known to those of ordinary skill in the art. In some cases, a photoreactive species may be incorporated into wide variety of monomers, which can then be polymerized using known methods. For example, the monomer may be designed and synthesized to include a photoreactive species and at least two polymerization sites, i.e., at least two sites which may form bonds with other species in a polymerization reaction. Those of ordinary skill in the art would be able to select the appropriate species in order to obtain a desired polymeric product, as well as additional groups and/or reaction conditions that would be compatible with (e.g, stable to) the polymerization reaction. For example, protecting group chemistry may be used in order to prevent undesired reaction between sites, and may facilitate reaction between polymerization sites within monomers.

In some cases, the monomer may comprise groups that are capable of undergoing a metathesis reaction (e.g., olefins, enynes). In some cases, monomers comprising two hydroxyl groups may be polymerized with monomers comprising two carbonyl groups (e.g, acyl halide, carboxylic acid, etc.) to form a polyether via condensation polymerization. Likewise, monomers comprising a styrene moiety may be polymerized to form polystyrene via radical polymerization. In some embodiments, monomers comprising di-acetylene substituted aryl groups may be polymerized with monomers comprising di-halide substituted aryl groups to form poly (arylene ethynylene)s via cross-coupling polymerization.

Figure 6:
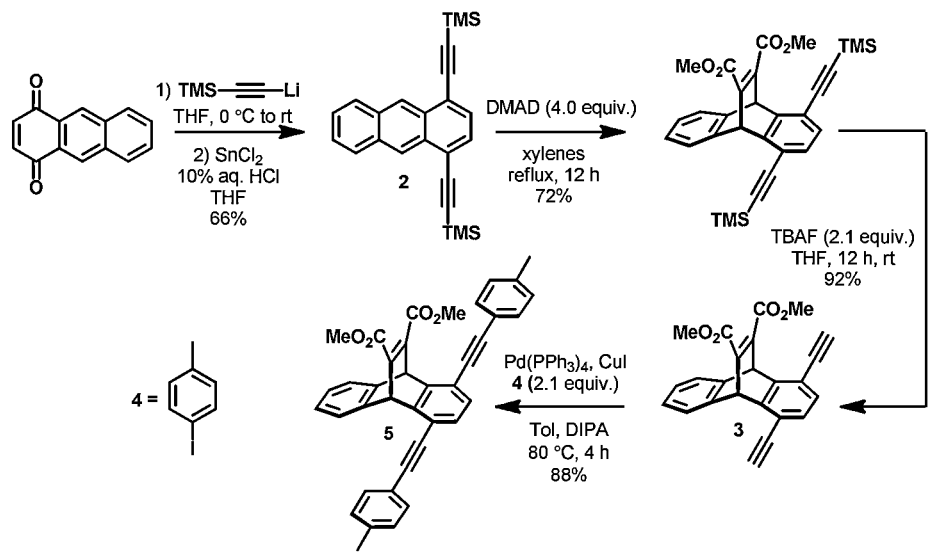
FIG. 6 shows the synthesis of model compound 5.
Figure 7:
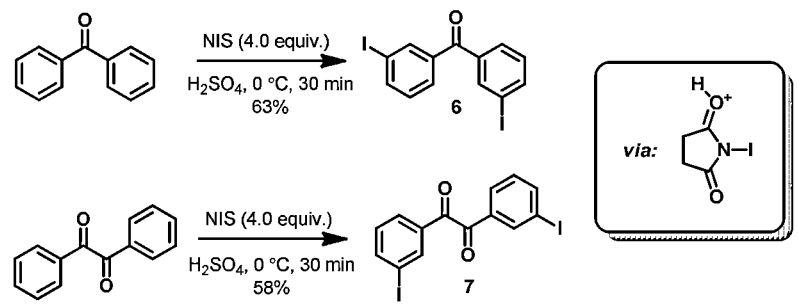
FIG. 7 shows the synthesis of comonomers 6 and 7.
Figure 8:
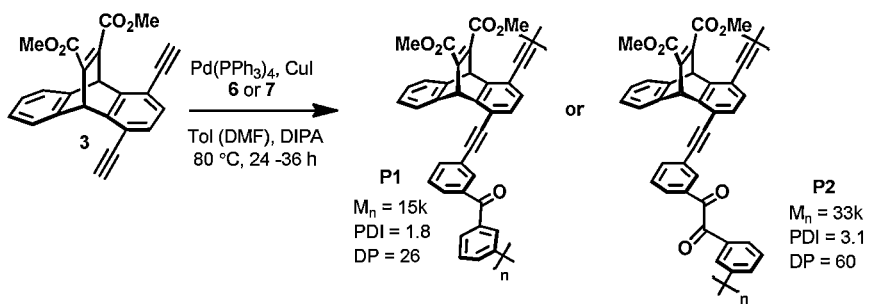
FIG. 8 shows the synthesis of photoalignment polymers P1 and P2.

As illustrative embodiments, the syntheses of polymer P1 and P2 are shown in FIGS. 6-8. As shown in FIG. 6, a diester-substituted dibenzobarrelene monomer is formed by the double addition of trimethylsilylacetylide to 1,4-anthraquinone followed by $SnCl_2$ mediated reductive aromatization to afford compound 2 in good yield. This compound then undergoes a Diels Alder reaction with DMAD followed by fluoride deprotection of the silyl groups to yield compound 3. Double Sonogashira-Hagihara cross-coupling of 3 with 4 afforded the model compound 5. Comonomers for the synthesis of P1 and P2 were synthesized according to FIG. 7. The comonomers were iodinated meta to the carbonyl group using concentrated sulfuric acid and N-iodosuccinimide (NIS) at low temperature. Polymers P1 and P2 were synthesized using Sonogashira-Hagihara cross-coupling chemistry as depicted in FIG. 8. The polymerization reactions were conducted for 24-36 hours yielding number-average molecular weights ($M_n$) of 15,000-33,000 g/mol. Those of ordinary skill in the art would be capable of selecting the appropriate reaction time for polymerization to produce a polymer having a particular desired number-average molecular weight.

As used herein, the term "polymer" or "polymer molecule" is given its ordinary meaning in the art and generally refers to extended molecular structures comprising polymer backbones and, optionally, pendant side groups. As used herein, the term "polymer backbone" refers to a linear chain of atoms within the polymer molecule by which other chains may be regarded as being pendant. In some cases, the backbone may be the longest chain of atoms within the polymer. The term "polymer" may be used to describe both polymers and oligomers. As used herein, an "oligomer" may refer to a polymer as described herein having 2-20 monomeric units. For example, an oligomer may refer to a dimer, a trimer, a tetramer, and the like. In some cases, the polymer is a conjugated polymer. The term "conjugated polymer" refers to a polymer in which electron density or electronic charge can be conducted along at least a portion of the polymer. Conjugated polymers comprise atoms capable of participating in delocalized bonding, such as pi-bonding or sigma-bonding. In some embodiments, a substantial length of the backbone (e.g., the entire backbone) may be conjugated. Examples of conjugated polymers include, but are not limited to, poly(arylene vinylene)s, poly(arylene ethynylene)s, polyarylenes, and the like.

The compositions described herein may be contacted with a range of materials to be aligned, including, for example, solvents, polymers, liquid crystals, or other anisotropic materials capable of being aligned. In some cases, the compositions described herein may be contacted with a liquid crystal. In some cases, the compositions may be molecularly dissolved in the liquid crystal. As used herein, the term "liquid crystal" is given its ordinary meaning in the art and refers to organic or organometallic materials having certain physical properties of both liquids and solids. For example, a liquid crystal phase may have the fluidity of a liquid, but may exhibit molecular ordering and anisotropic interactions with light, as in solids. In some cases, liquid crystals suitable for use include those which are capable of forming nematic phases, chiral nematic phases, or other liquid crystal phases useful in devices involving alignment and/or switching. Examples of common liquid crystals include as cyano-biphenyls, bicyclohexyls, cyclohexylphenyls, other nematic or chiral nematic liquid crystals, and the like. A liquid crystal may comprise a plurality of liquid crystalline species, each having a primary axis aligned so as to together define a "liquid crystal director," i.e., an average axis of liquid crystalline species primary axes.

Compositions, devices, and methods described herein may comprise at least one external source of energy applicable to the composition/device. In some cases, the source of external energy, when applied to composition/device, may cause a change in orientation of at least a portion of the composition/device. In some cases, the source of external energy, when applied to composition/device, causes a change in orientation of a liquid crystal or portion thereof. The source of external energy may be an electric, magnetic, optical, acoustic, electromagnetic, or mechanical field. In some embodiments, the source of external energy is electromagnetic radiation. The source of external energy can be provided in combination with the device in a variety of ways, such as being integrally and/or functionally connected to the composition/device (for example, by providing a compartment or other assembly supporting both the composition and the energy source), or in combination such that the composition/device and energy source can be used together (e.g., packaged together, or otherwise provided together and with the ability to arrange each, with respect to the other, for use as described herein).

The term "alkyl" refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. The alkyl groups may be optionally substituted, as described more fully below. Examples of alkyl groups include, but are not limited to, methyl, ethyl, propyl, isopropyl, butyl, isobutyl, tert-butyl, 2-ethylhexyl, cyclopropyl, cyclobutyl, cyclopentyl, cyclohexyl, and the like. "Heteroalkyl" groups are alkyl groups wherein at least one atom is a heteroatom (e.g., oxygen, sulfur, nitrogen, phosphorus, etc.), with the remainder of the atoms being carbon atoms. Examples of heteroalkyl groups include, but are not limited to, alkoxy, poly(ethylene glycol)-, alkyl-substituted amino, tetrahydrofuranyl, piperidinyl, morpholinyl, etc.

The terms "alkenyl" and "alkynyl" refer to unsaturated aliphatic groups analogous to the alkyl groups described above, but containing at least one double or triple bond respectively. The "heteroalkenyl" and "heteroalkynyl" refer to alkenyl and alkynyl groups as described herein in which one or more atoms is a heteroatom (e.g., oxygen, nitrogen, sulfur, and the like).

The term "aryl" refers to an aromatic carbocyclic group having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl), all optionally substituted. "Heteroaryl" groups are aryl groups wherein at least one ring atom in the aromatic ring is a heteroatom, with the remainder of the ring atoms being carbon atoms. Examples of heteroaryl groups include furanyl, thienyl, pyridyl, pyrrolyl, N-lower alkyl pyrrolyl, pyridyl-N-oxide, pyrimidyl, pyrazinyl, imidazolyl, indolyl and the like, all optionally substituted.

The terms "amine" and "amino" refer to both unsubstituted and substituted amines, e.g., a moiety that can be represented by the general formula: N(R')(R'')(R''') wherein R', R'', and R''' each independently represent a group permitted by the rules of valence.

The terms "acyl," "carboxyl group," or "carbonyl group" are recognized in the art and can include such moieties as can be represented by the general formula:

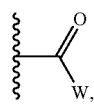

wherein W is H, OH, O-alkyl, O-alkenyl, or a salt thereof. Where W is O-alkyl, the formula represents an "ester." Where W is OH, the formula represents a "carboxylic acid." In general, where the oxygen atom of the above formula is replaced by sulfur, the formula represents a "thiolcarbonyl" group. Where W is S-alkyl, the formula represents a "thiolester." Where W is SH, the formula represents a "thiolcarboxylic acid." On the other hand, where W is alkyl, the above formula represents a "ketone" group. Where W is hydrogen, the above formula represents an "aldehyde" group.

As used herein, the term "substituted" is contemplated to include all permissible substituents of organic compounds, "permissible" being in the context of the chemical rules of valence known to those of ordinary skill in the art. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl" must still comprise the phenyl moiety and cannot be modified by substitution, in this definition, to become, e.g., a heteroaryl group such as pyridine. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. The heteroatoms such as nitrogen may have hydrogen substituents and/or any permissible substituents of organic compounds described herein which satisfy the valencies of the heteroatoms. Embodiments described herein are not intended to be limited in any manner by the permissible substituents of organic compounds.

Examples of substituents include, but are not limited to, halo, carbonyl group, alkyl, aryl, aralkyl, cyclic alkyl, heterocycloalkyl, hydroxy, alkoxy, aryloxy, perhaloalkoxy, aralkoxy, heteroaryl, heteroaryloxy, heteroarylalkyl, heteroaralkoxy, azido, amino, halogen, alkylthio, oxo, acylalkyl, carboxy esters, carboxyl, carboxamido, nitro, cyano, acyloxy, aminoalkyl, alkylaminoaryl, alkylaryl, alkylaminoalkyl, alkoxyaryl, arylamino, aralkylamino, alkylsulfonyl, carboxamidoalkylaryl, carboxamidoaryl, hydroxyalkyl, haloalkyl, alkylaminoalkylcarboxy, aminocarboxamidoalkyl, alkoxyalkyl, perhaloalkyl, arylalkyloxyalkyl, and the like.

The term "electron-rich group" or "electron-donating group" refers to a functionality which draws electrons to itself less than a hydrogen atom would at the same position. Exemplary electron-donating groups include amino, methoxy, and the like.

The term "electron-poor group" "electron-withdrawing group" is recognized in the art and as used herein means a functionality which draws electrons to itself more than a hydrogen atom would at the same position. Exemplary electron-withdrawing groups include nitro, cyano, carbonyl groups (e.g., aldehydes, ketones, esters, etc.), sulfonyl, trifluoromethyl, and the like.

EXAMPLES

Materials and Methods:

Toluene, $CH_2Cl_2$ and THF were purified by passage through solvent purification columns containing activated alumina. N,N-Dimethylformamide (DMF) was distilled from $MgSO_4$ and stored over 4 Å molecular sieves. Diisopropylamine was distilled from $CaH_2$. All other reagents were obtained from commercial sources and used as received unless otherwise noted.

Instrumentation:

NMR spectra were recorded on Varian Mercury 300 MHz, Varian Inova 500 MHz or Varian Inova 501 MHz spectrometers. Chemical shifts were reported in ppm and referenced to residual NMR solvent peaks ($CDCl_3$: δ 7.27 ppm for $^1H$, δ 77.23 ppm for $^{13}C$). High-resolution mass spectra (HRMS)

were obtained at the MIT Department of Chemistry using a peak-matching protocol to determine the mass and error range of the molecular ion. Electrospray or direct analysis in real time (DART), operating in negative ion mode, were used as the ionization techniques. Melting points were measured on a MeI-Temp II apparatus (Laboratory Devices INC) and were not corrected. Number average molecular weights ($M_n$) and polydispersity (PDI) of polymers were obtained on a HP series 1100 gel permeation chromatography (GPC) system in THF and calibrated with polystyrene standards and utilizing both UV (450 nm) and refractive index detection. UV-vis spectra were measured on an Agilent 8453 diode array spectrophotometer and corrected for background signal with a solvent filled cuvette. Fluorescence spectra were obtained using a SPEX Fluorolog-τ3 fluorimeter using right-angle detection (solution measurements) or front-face detection (thin film measurements). Thin films containing P1 and P2 were fabricated by spin-coating (5000 RPM for 1 min) chloroform solutions of the appropriate concentrations (Specialty Coating Systems™ G3P-8 Spincoat). The films were then placed under vacuum to ensure complete removal of the residual solvent. Photolysis experiments were carried out using a BlueWave® 200 light curing system from Dymax. A FGUV W53199 UV filter from Thorlabs, Inc. was used generate 360 nm light output (36 mW/cm$^2$). Linearly polarized irradiation was achieved using a Glan-Taylor polarizer.

Example 1

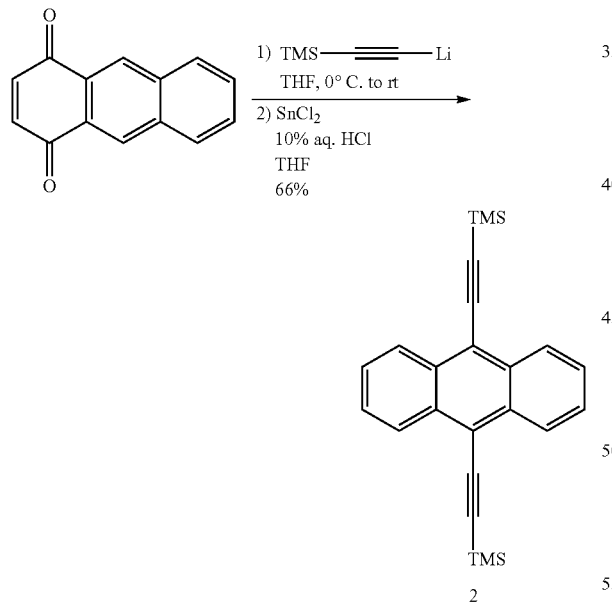

1,4-Bis[(trimethylsilyl)ethynyl]anthracene (2). Compound 2 was prepared based on a preparation described by Tannaci et al, Chem. Commun. 2009, 233. A flame dried flask was charged with dry THF (40 mL) and ethynyltrimethylsilane (1.42 g, 14.41 mmol). To this solution was added butyllithium (8.8 mL, 1.6 M) drop-wise over a period of 30 minutes at 0° C. under a nitrogen atmosphere. This solution was stirred and allowed to warm to room temperature (~1 hour). After 1 hour, 1,4-anthraquinone (1 g, 4.80 mmol) was added as a single solid portion to the stirring solution. The reaction mixture immediately turned purple upon addition of the solid. The solution was stirred at room temperature for 12 h at room temperature and monitored by TLC. To this solution was added saturated SnCl$_2$ in 10% aqueous HCl (10 mL). The solution immediately changed from a purple to orange color and the reaction monitored by thin-layer chromatography. Upon completion, the reaction mixture was partitioned between water and hexanes. The organic phase was washed three times with water and passed through a plug of silica gel. The resulting yellow solid was further purified by recrystallization from ethanol to yield 1.2 g (66%) of a brilliant yellow solid. mp 169° C. $^1$H NMR (125 MHz, CDCl$_3$): δ 8.93 (s, 2H), 8.06-8.11 (m, 2H), 7.69 (s, 2H), 7.54-7.58 (m, 2H), 0.45 (s, 18H). $^{13}$C NMR (501 MHz, CDCl$_3$): δ 132.90, 131.23, 130.45, 129.24, 126.93, 126.44, 122.44, 103.90, 102.59, 0.89.

Example 2

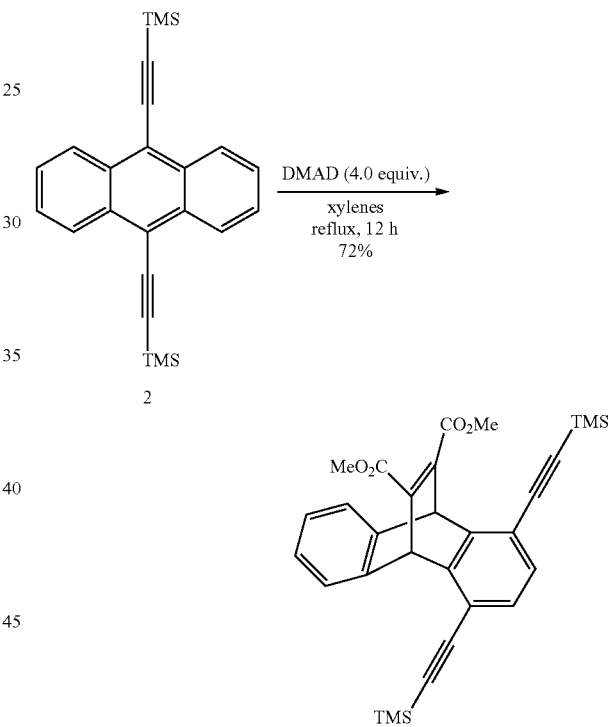

Dimethyl 1,4-bis[(trimethylsilyl)ethynyl]-9,10-dihydro-9,10-ethenoanthracene-11,12-dicarboxylate. The title compound was prepared using a procedure similar to that reported by McNeil et al., J. Am. Chem. Soc. 2006, 128, 12426. To a flame dried 50 mL round-bottom flask was added compound 2 (1.0 g, 2.69 mmol), DMAD (1.53 g, 10.79 mmol), and 10 mL of dry o-xylenes. The reaction was refluxed under a nitrogen atmosphere for 12 h. The reaction was cooled to room temperature, concentrated in vacuo and purified by column chromatography using 90/10 hexanes/EtOAc. The material was then triturated with cold methanol to remove any residual DMAD. The off-white solid was dried in vacuo to yield 0.99 g (1.94 mmol) of the target compound. $^1$H NMR (501 MHz, CDCl$_3$): δ 7.40-7.41 (m, 2H), 7.04-7.06 (m, 4H), 5.95 (s, 2H), 3.82 (s, 6H), 0.35 (s, 18H). $^{13}$C NMR (125 MHz, CDCl$_3$): δ 166.16, 147.77, 146.902, 143.812, 128.65, 126.37, 124.95, 119.51, 102.48,

Example 3

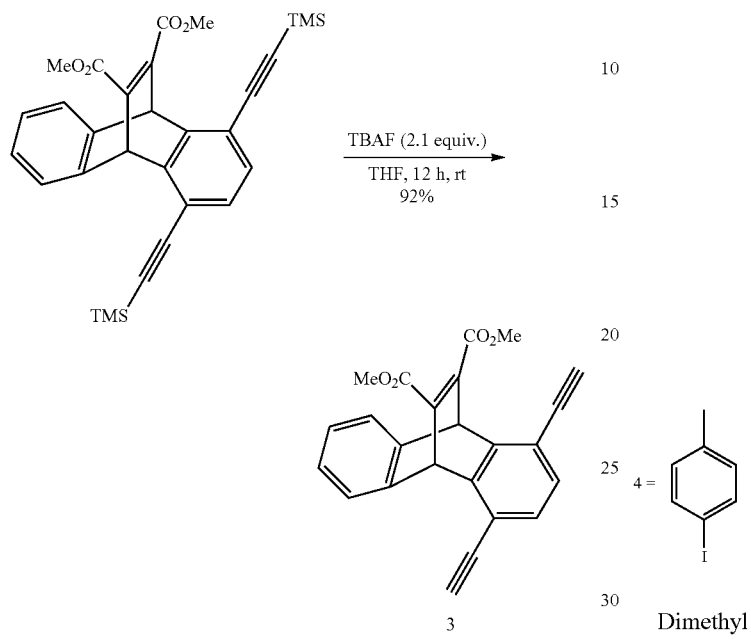

Dimethyl 1,4-diethynyl-9,10-dihydro-9,10-ethenoanthracene-11,12-dicarboxylate (3). To a flame-dried 50 mL round-bottom flask was added dry THF (20 mL) and dimethyl 1,4-bis[(trimethylsilyl)ethynyl]-9,10-dihydro-9,10-ethenoanthracene-11,12-dicarboxylate (0.5 g, 0.975 mmol) under a nitrogen atmosphere. TBAF (2.05 mL, 1.0 M) was added slowly via a syringe and allowed to stir overnight. The reaction mixture was concentrated in vacuo and purified by silica gel column chromatography using 2:1 (hexanes/$CH_2Cl_2$) to afford an off-white solid (0.33 g, 0.897 mmol, 92%). $^1$H NMR (501 MHz, $CDCl_3$): δ 7.47-7.45 (m, 2H), 7.16 (s, 2H), 7.06-7.08 (m, 2H), 5.99 (s, 2H), 3.8 (s, 6H), 3.43 (s, 2H). $^{13}$C NMR (125 MHz, $CDCl_3$): δ 165.83, 146.97, 146.70, 143.18, 128.90, 126.04, 124.56, 118.39, 82.58, 80.49, 52.81, 50.69. MS (DART) calc for $C_{24}H_{16}O_4$ [M+H]$^-$: 369.1121, found 369.1135.

Example 4

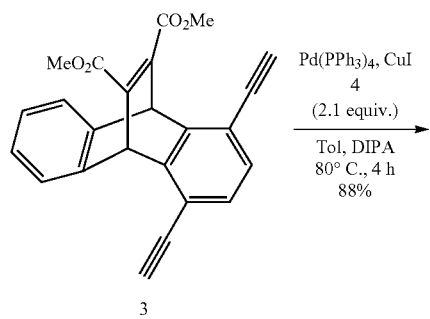

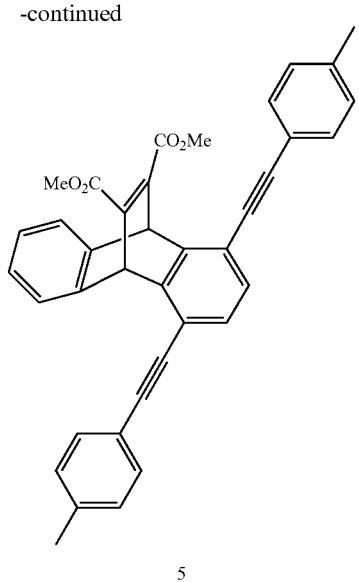

4 =

Dimethyl 1,4-bis(p-tolylethynyl)-9,10-ethenoanthracene-11,12-dicarboxylate (5). To a flame-dried 10 mL Schlenk flask was added dry toluene (5 mL), dry diisopropylamine (2 mL), compound 3 (0.05 g, 0.136 mmol), and compound 4 (0.062 g, 0.285 mmol) under a nitrogen atmosphere. The flask was evacuated and refilled with nitrogen three times followed by addition of a spatula tip of tetrakis(triphenylphosphine)palladium and CuI. The vessel was sealed and heated to 80° C. for 4 h with stirring under a nitrogen atmosphere. The reaction mixture was then cooled to room temperature, concentrated in vacuo and partitioned between $CH_2Cl_2$ and water. The organic phase was washed with saturated $NH_4Cl$ (aq) solution followed by three washes with water. The organic phase was concentrated in vacuo and purified by silica gel column chromatography using 2:1 (Hexanes:$CH_2Cl_2$). The light brown powder was dried in vacuo to yield 0.66 g (0.119 mmol, 88%) of the title compound. $^1$H NMR (501 MHz, $CDCl_3$): δ 7.53-7.54 (d, J=7.85 Hz, 4H), 7.47-7.48 (m, 2H), 7.24-7.25 (d, J=7.85 Hz, 4H), 7.17 (s, 2H), 7.05-7.07 (m, 2H), 6.07 (s, 2H), 3.83 (s, 6H), 2.43 (s, 6H). $^{13}$C NMR (125 MHz, $CDCl_3$): δ 166.37, 147.74, 146.36, 143.94, 139.61, 132.34, 129.99, 128.73, 126.40, 125.01, 120.71, 119.60, 95.35, 86.46, 53.25, 51.54, 22.34. MS (DART) calc for $C_{38}H_{28}O_4$ [M+H]$^-$: 549.2060, found 549.2059.

Example 5

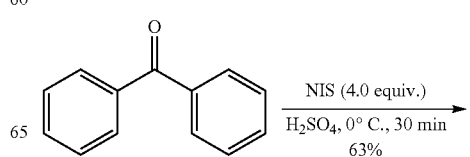

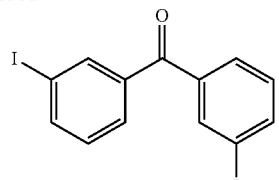

Bis(3-iodophenyl)methanone (6). The title compound was prepared by following the literature procedure reported by Chaikovskii et al., Organicheskoi Khimii 2007, 43, 1285. To a round-bottom flask was added 30 mL of sulfuric acid (90%) and cooled to 0° C. with an ice bath. To this solution was added N-iodosuccinimide (2.25 g, 10 mmol) and the reaction was stirred until it became homogenous. To this solution was added benzophenone (0.46 g, 2.5 mmol) as a single solid portion and the solution was stirred for 4 h. The reaction mixture was then poured onto a 100 mL ice/water mixture and treated with $Na_2SO_3$ solution. The mixture was partitioned between $CH_2Cl_2$ and water and the organic phase was washed three times with water. The organic phase was concentrated in vacuo and the resulting solid purified by recrystallization (EtOH) to yield 0.69 g (1.58 mmol, 63%) of a white crystalline solid. mp 146° C. $^1$H NMR (501 MHz, $CDCl_3$): δ 8.12 (s, 2H), 7.93-7.95 (d, J=7.48 Hz, 2H), 7.70-7.72 (d, J=7.48 Hz, 2H), 7.23-7.26 (t, J=8.39 Hz, 2H). $^{13}$C NMR (125 MHz, $CDCl_3$): δ 194.18, 142.27, 139.47, 139.25, 130.77, 129.80, 94.96.

Example 6

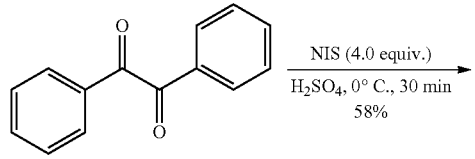

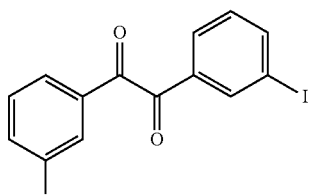

1,2-bis(3-iodophenyl)ethane-1,2-dione (7). The title compound was prepared using the same procedure and quantities described above. Yield=0.70 g (58%). mp 127° C. $^1$H NMR (501 MHz, $CDCl_3$): δ 8.31 (s, 2H), 7.99-8.01 (d, J=6.89 Hz, 2H), 7.89-7.92 (d, J=6.89 Hz, 2H), 7.25-7.28 (t, J=8.01 Hz, 2H). $^{13}$C NMR (125 MHz, $CDCl_3$): δ 192.04, 144.03, 138.67, 134.55, 130.92, 129.44, 94.95.

Example 7

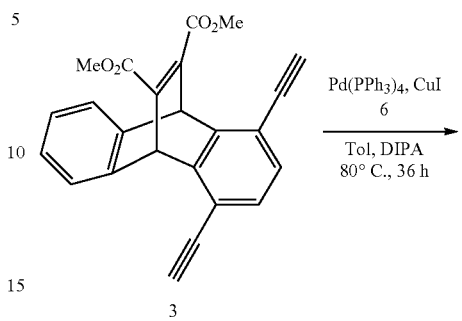

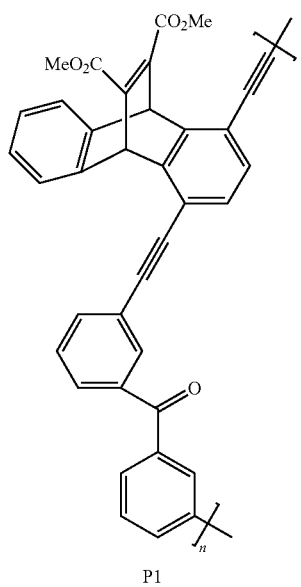

P1. To a flame-dried 25 mL Schlenk flask was added dry toluene (5 mL), dry diisopropylamine (3 mL), compound 3 (0.1 g, 0.271 mmol) and compound 6 (0.118 g, 0.271 mmol). The reaction vessel was subjected to one cycle of freeze-pump-thaw where during the freeze cycle a spatula tip quantity of tetrakis(triphenylphosphine)palladium and CuI was added. The reaction mixture was then subjected to two additional freeze-pump-thaw cycles and heated to 80° C. for 36 h under a nitrogen atmosphere. The solution was cooled to room temperature and reprecipitated directly into cold acetone (200 mL). The white polymeric material was partitioned between $CHCl_3$ and water, washed once with sat. $NH_4Cl$ (aq) and washed three times with water. The organic phase was concentrated in vacuo to a volume of approximately 1 mL and reprecipitated from cold acetone to yield 0.09 g (61%) of a white powder. GPC gave $M_n$=15,000; PDI=1.8, DP=26. $^1$H NMR (501 MHz, $CDCl_3$): δ 8.08 (broad, 2H), 7.84 (broad, 4H), 7.57 (broad, 2H), 7.44 (broad, 2H), 7.17 (broad, 2H), 7.00 (broad, 2H), 6.03 (broad, 2H), 3.77 (broad, 6H). $^{13}$C NMR (125 MHz, $CDCl_3$): δ 166.18, 147.58, 146.81, 143.58, 138.29, 136.31, 133.65, 130.77, 129.39, 128.93, 126.51, 125.04, 124.36, 119.30, 94.11, 88.14, 53.25, 51.48.

Example 8

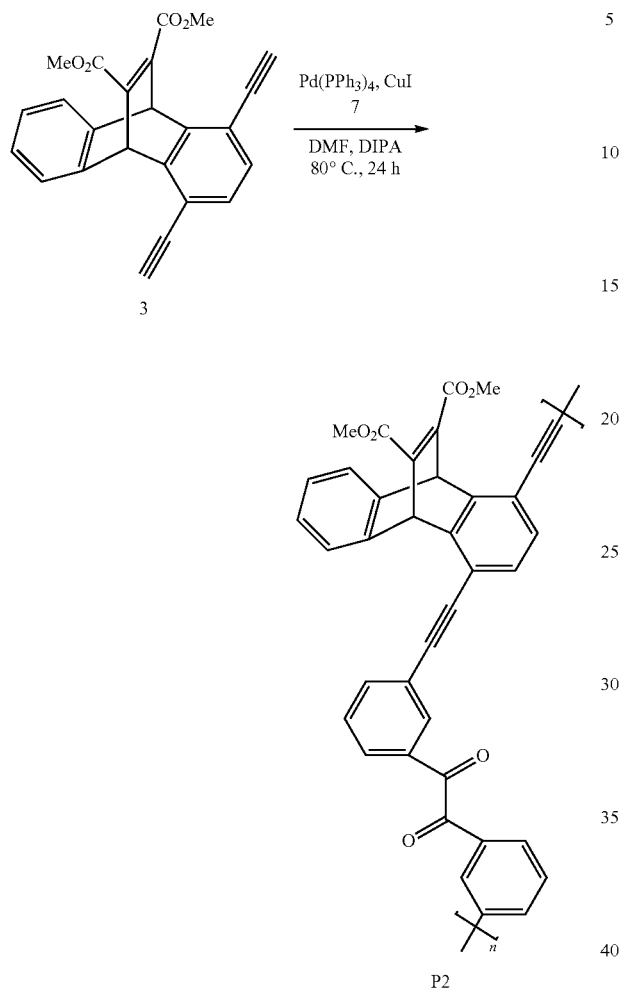

P2. To a flame-dried 25 mL Schlenk flask was added dry DMF (5 mL), dry diisopropylamine (3 mL), compound 3 (0.1 g, 0.271 mmol) and compound 7 (0.125 g, 0.271 mmol). The reaction vessel was subjected to one cycle of freeze-pump-thaw where during the freeze cycle a spatula tip quantity of tetrakis(triphenylphosphine)palladium and CuI was added. The reaction mixture was then subjected to two additional freeze-pump-thaw cycles and heated to 80° C. for 24 h under a nitrogen atmosphere during which time the target polymer appeared to crash out of the reaction. The vessel was cooled and the precipitate isolated by filtration. This white powder was taken up in $CHCl_3$ and washed with sat. $NH_4Cl$ (aq) and water (3 times). The organic layer was isolated and concentrated to a volume of approximately 1 mL and then reprecipitated from cold methanol (200 mL) to yield 0.064 g (41%) of the target polymer. GPC gave $M_n$=33,000; PDI=3.1, DP=60. $^1$H NMR (501 MHz, $CDCl_3$): δ 8.3 (broad, 2H), 8.07 (broad, 2H), 7.97 (broad, 2H), 7.66 (broad, 2H), 7.51 (broad, 2H), 7.23 (broad, 2H), 7.10 (broad, 2H), 6.07 (broad, 2H), 3.85 (broad, 6H). $^{13}$C NMR (125 MHz, $CDCl_3$): δ 193.70, 166.24, 147.66, 146.93, 143.63, 138.63, 133.73, 133.65, 130.76, 130.68, 130.10, 129.12, 126.7, 125.14, 119.33, 93.63, 88.68, 53.39, 51.54.

Example 9

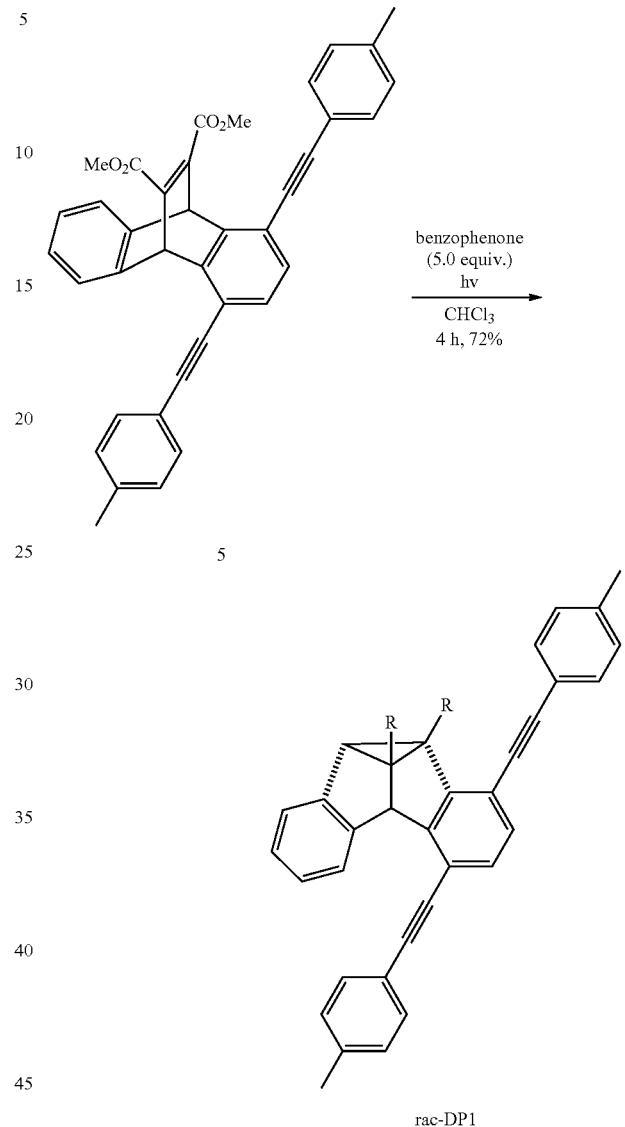

rac-DP1. The title compound was synthesized by the bulk photolysis of compound 5 in $CHCl_3$ using benzophenone as a triplet sensitizer. To a rubber septum-stoppered quartz cuvette was added dry $CHCl_3$ (3.0 mL), compound 5 (0.05 g, 0.091 mmol) and benzophenone (0.083 g, 0.456 mmol). The cuvette was sparged with argon for 15 minutes and then irradiated with a lamp for 4 h. After photolysis, the reaction mixture was concentrated in vacuo and purified via silica gel column chromatography using hexanes/acetone (30:1).

Example 10

Previous work has exploited the intramolecular free volume (IFV) associated with triptycene-based structures to create polymers that are strongly aligned in liquid crystalline media. (See, for example, Zhu, Z.; Swager, T. M. J. Am. Chem. Soc. 2002, 124, 9670; Long, T. M.; Swager, T. M. J.

Am. Chem. Soc. 2002, 124, 3826; and Hoogboom, J.; Swager, T. M. J. Am. Chem. Soc. 2006, 128, 15058.)

Figure 4:
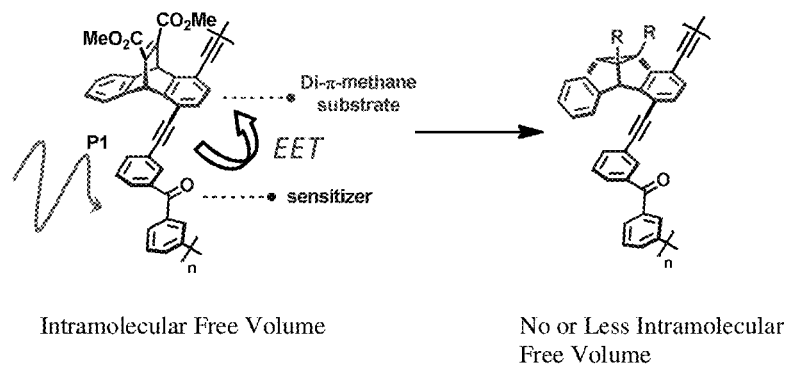
FIG. 4 shows the di-pi-methane rearrangement of a polymer, reducing the intramolecular free volume of the polymer.

In this example, a polymer containing two functional units was synthesized as shown in FIG. 4. The first unit is a di-pi-methane substrate (e.g., a diester substituted dibenzobarrelene structure). This unit serves two purposes: (i) with a rigid carbocyclic structure similar to that of triptycene, the diester substituted dibenzobarrelene structure can form favorable interactions with an LC phase and (ii) also serves as a di-π-methane substrate. Upon di-pi-methane rearrangement, the resulting product, as shown in FIGS. 4-5, exhibits a lower level of IFV and interacts poorly with the LC phase, relative to the original structure (e.g., pre-di-pi-methan rearrangement structure).

By using linearly polarized light to initiate the di-pi-methane rearrangement, only chromophores with transition dipole moments oriented parallel to the polarized light source will undergo the transformation. The remaining chromophores retain their IFV and lead to a net anisotropy at the polymer LC phase and generate an alignment axis for the LC phase to couple with (FIG. 5).

Because it is a rigid system, the rearrangement proceeds through a triplet manifold thereby requiring the presence of a triplet sensitizer. During photoexcitation with linearly polarized light, the benzophenone units (exhibiting the proper orientation with respect to the light source) are excited to the first singlet state and then quickly crossover to the first excited triplet state through intersystem crossing. Incorporation of sensitizer units directly into the backbone can enhance Dexter energy transfer thereby exciting the dibenzobarrelene units to their triplet state followed by the di-π-methane rearrangement.

Example 11

Figure 9:
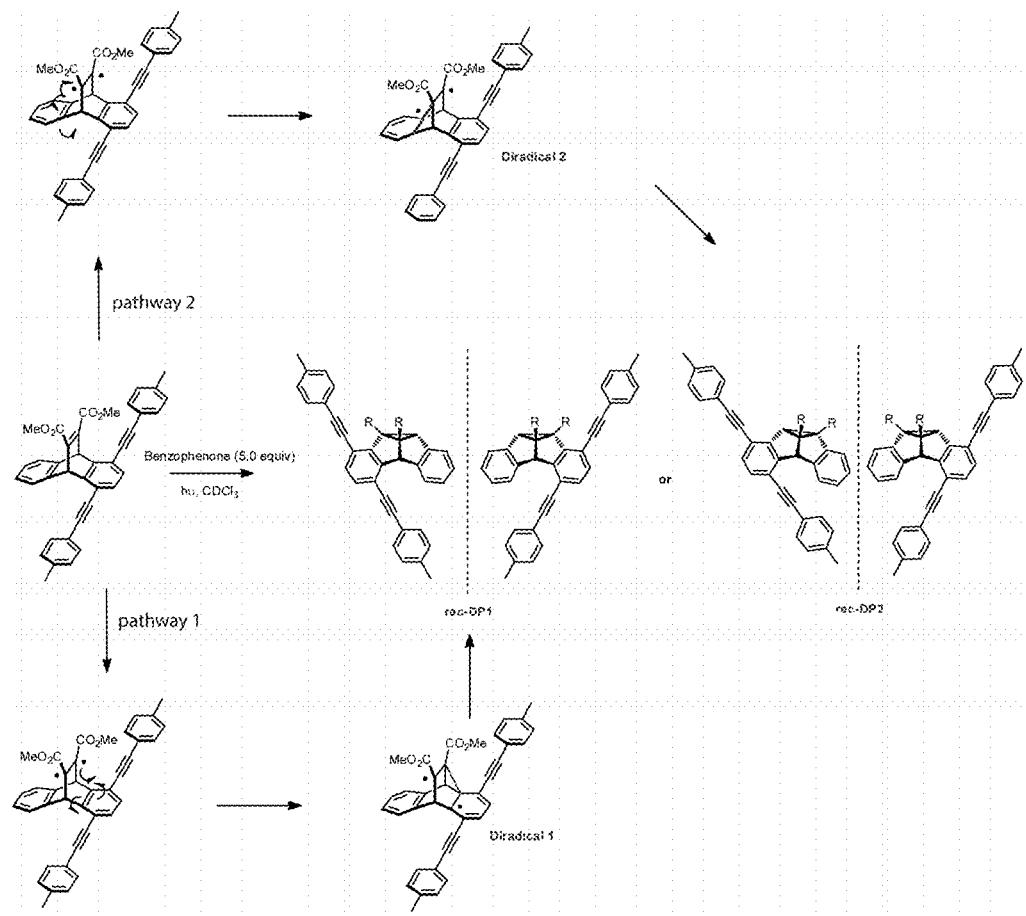
FIG. 9 illustrates the regiochemical pathways during photolysis of model compound 5.

In this example, the photochemistry of a model compound and of photoalignment polymers is investigated. Polymers P1 and P2, as shown in FIG. 8, contain di-π-methane substrates that each can yield two different regioisomers upon photolysis. To probe the regiochemical behavior of the dibenzobarrelene scaffold, the photochemistry of model compound 5 was investigated. As shown in FIG. 9, the photolysis of 5 may give rise to racemic mixtures of two regioisomers. The regiochemistry of this transformation is controlled by the formation of the bridged diradical species shown in FIG. 9. There are two possibilities present, in one case the diradical could be centered on the lone arene ring (Diradical 2, FIG. 9). However, loss of aromaticity makes this diradical particularly unstable. Without wishing to be bound by theory, the extended conjugation of the ethynyl-bridged arene system may make diradical 1 more stable and give rise to photoproduct rac-DP1 as the major product. (FIG. 9)

Figure 10:
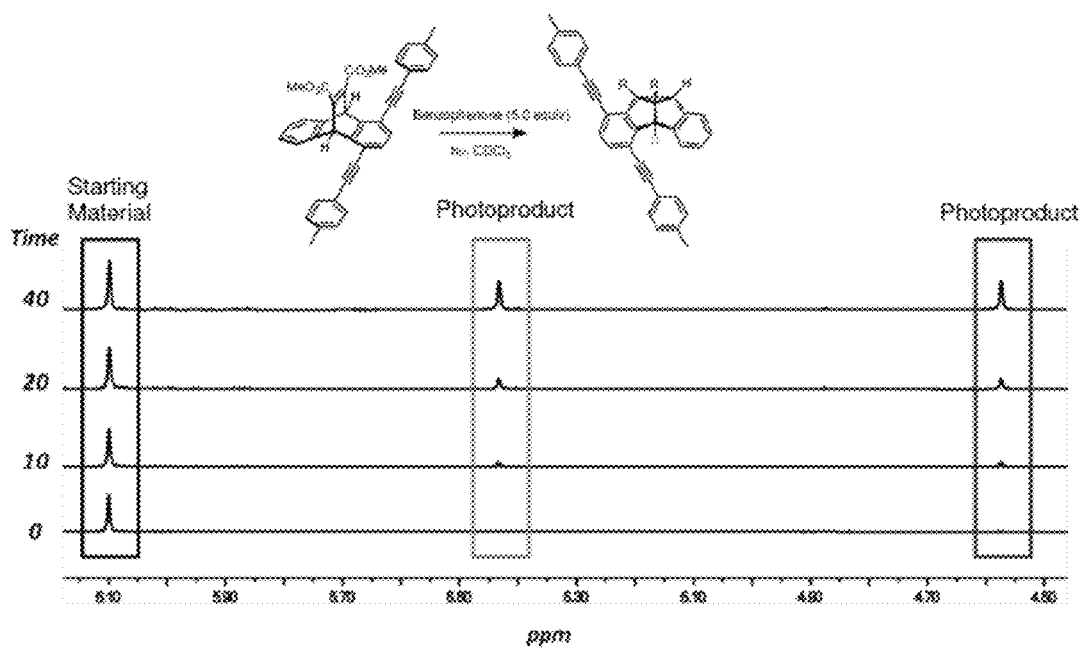
FIG. 10 shows the proton NMR spectra illustrating the di-pi-methane rearrangement reaction of model compound 5.

Photolysis of 5 in chloroform using benzophenone as the triplet sensitizer gave rise to predominantly one set of new peaks as shown in FIG. 10. Notably, the NMR spectrum in FIG. 10 is for the crude mixture in which only signals from starting material and product can be observed, exemplifying the efficiency of the di-π-methane transformation and its possible utility as a photoalignment reaction. In order to determine the regiochemistry of the rearrangement the major photoproduct was isolated by column chromatography. The product was analyzed via 2D NMR techniques and determined to be rac-DP1.

Figure 11:
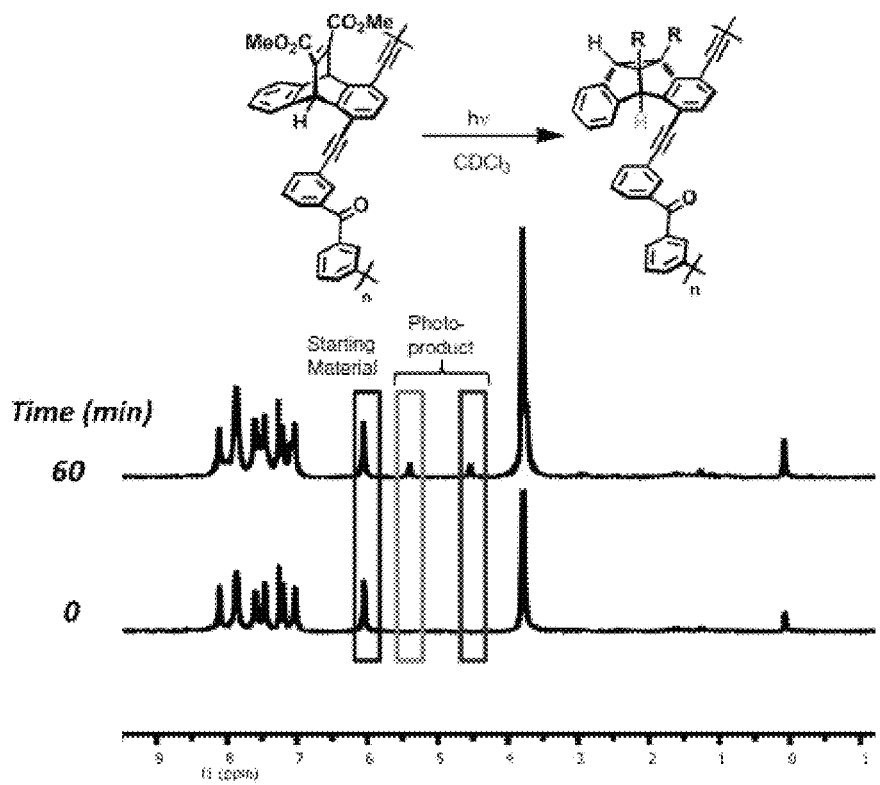
FIG. 11 shows the proton NMR spectra illustrating the di-pi-methane rearrangement reaction of polymer P1.

The photochemistry of photoalignment polymers P1 and P2 was then studied. The reactions were carried out in CDCl$_3$ and monitored by $^1$H NMR spectroscopy. The results of the photolysis of P1 are shown in FIG. 11. The photolysis of P1 in CDCl$_3$ cleanly yields the di-π-methane photoproduct. New methine resonances at 5.5 and 4.5 ppm are observed after 60 minute which closely match the chemical shifts of the methines formed during the photolysis of model compound 5. The generation of only two new methine peaks is indicative of the high regioselectivity of this transformation and is analogous to the observed regioselectivity of the model compound. It is noteworthy that the photolysis of P1 was carried out in the presence of air. Typically, triplet sensitized photochemical transformations are carried out in degassed solutions as oxygen can easily quench the triplet state of the sensitizer. However, in the case of P1, incorporation of the triplet sensitizer in the polymer backbone positions the sensitizer adjacent to the di-π-methane substrate and enhances the rate of energy transfer. This enhancement alleviates the need to remove oxygen as the rate of energy transfer is faster than the diffusion rate of oxygen in solution. Thus, an advantageous feature of embodiments described herein is that photolysis of photoalignment films can be carried out in air as opposed to an inert atmosphere.

Figure 12:
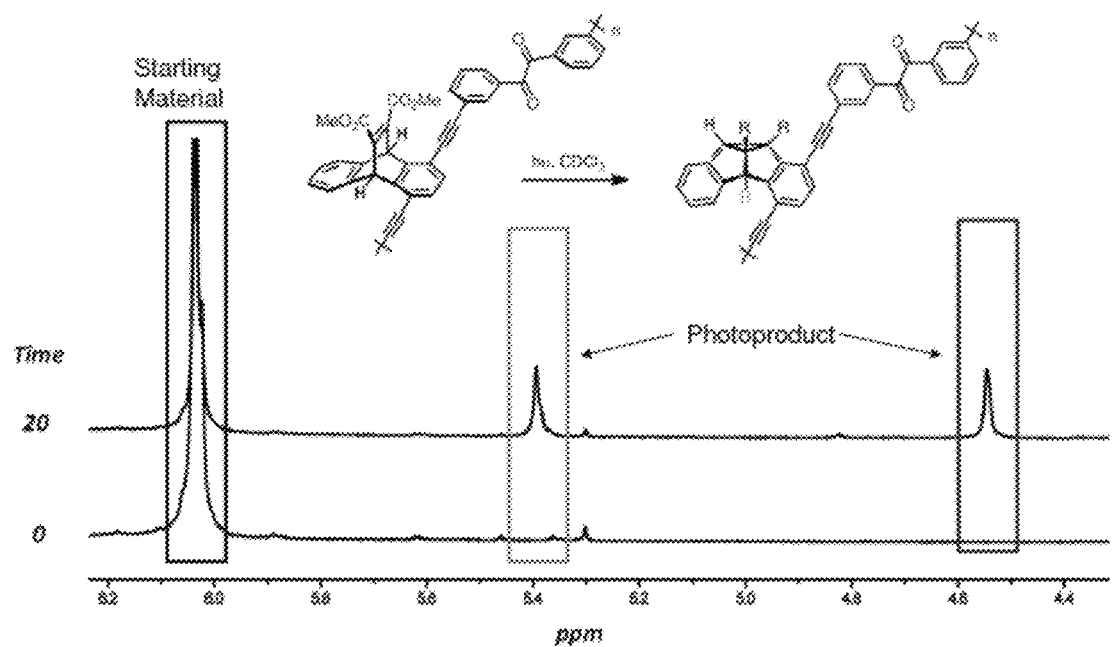
FIG. 12 shows the proton NMR spectra illustrating the di-pi-methane rearrangement reaction of polymer P2.

The photolysis of P2 closely resembled that of P1. (FIG. 12). The major difference between these two polymers was the choice of the triplet sensitizer. Both benzil and benzophenone are efficient triplet sensitizers with intersystem crossing rates of near unity. However, while the triplet energy of benzil is substantially lower than that of benzophenone ($E_{T,benzil}$=54 kcal/mol, $E_{T,benzophenone}$=69 kcal/mol), indicating that energy transfer from benzophenone to the di-π-methane substrate should be more exothermic and therefore more efficient than energy transfer from benzyl, the rates of rearrangement for the two polymers are very similar (11% product formation P2, 17% product formation P1 after 20 minutes of continuous irradiation) suggesting that the rate limiting step does not involve energy transfer.

Figure 13:
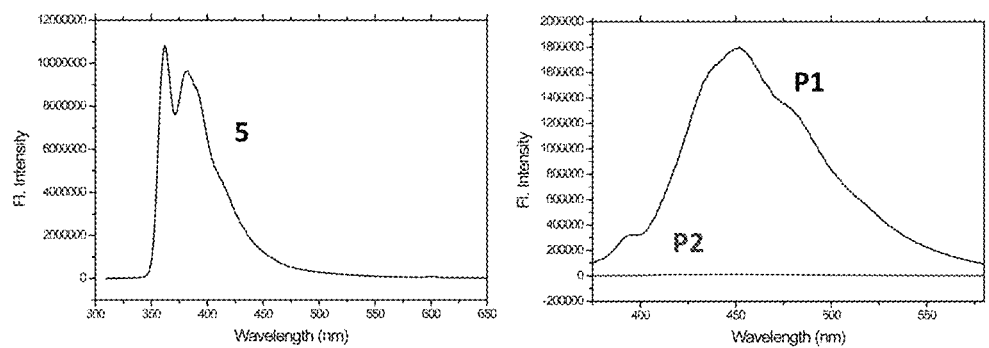
FIG. 13 shows fluorescence spectra of model compound 5, and polymers P1 and P2. Spectra were taken in dichloromethane solution using $\lambda_{ex}$=300 nm with O.D. of 0.1 for all components.

As shown in FIG. 13, the fluorescence spectra of 5, P1, and P2 revealed that the emission from P1 exhibits a bathochromic shift of approximately 100 nm compared to model compound 5 and also lacks the well resolved vibrational structure characteristic of these chromophores. Neither polymer exhibited any emission similar to that of 5 (despite using a $\lambda_{ex}$=300 nm), suggesting that the emission from the dibenzobarrelene core is sufficiently quenched by the triplet sensitizer. This is consistent with an energy transfer cascade whereby excitation of the dibenzobarrelene core is followed by energy transfer (Dexter or FRET) to the sensitizer which then undergoes intersystem crossing to the lowest triplet state followed by back energy transfer (Dexter) to the dibenzobarrelene unit with subsequent rearrangement. The origin of the emission from P1 is unknown and may be due to an impurity or defect site in the polymer backbone (alkyne homocoupling).

Example 12

This examples describes the alignment of liquid crystal phases using polymer P1.

In order to test the alignment capabilities of P1, a devices as shown in FIG. 3B was fabricated. The fabrication process began with formation of a thin film of P1 on a clean glass substrate followed by polarized irradiation. This process was repeated on a second substrate and the two slides were sandwiched together with 6 μm spacers and sealed with epoxy. The cells were then filled with the LC material at a temperature above the clearing point of the LC and allowed to slowly cool to the nematic phase. The alignment was observed via polarized optical microscopy (POM) on a rotating stage with crossed polarizers.

Figure 14A:
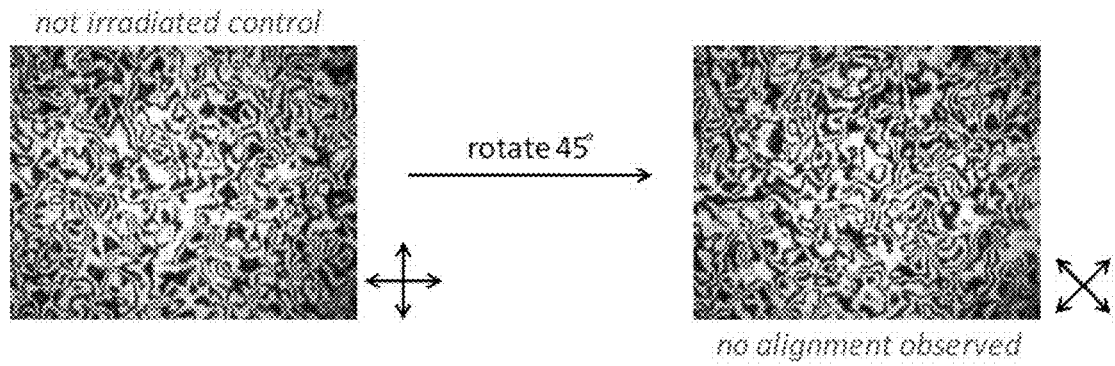
FIG. 14 shows the optical micrographs of the LC cells where (a) photopolymer P1 has not been irradiated or (b) has been irradiated with polarized light.
Figure 14B:
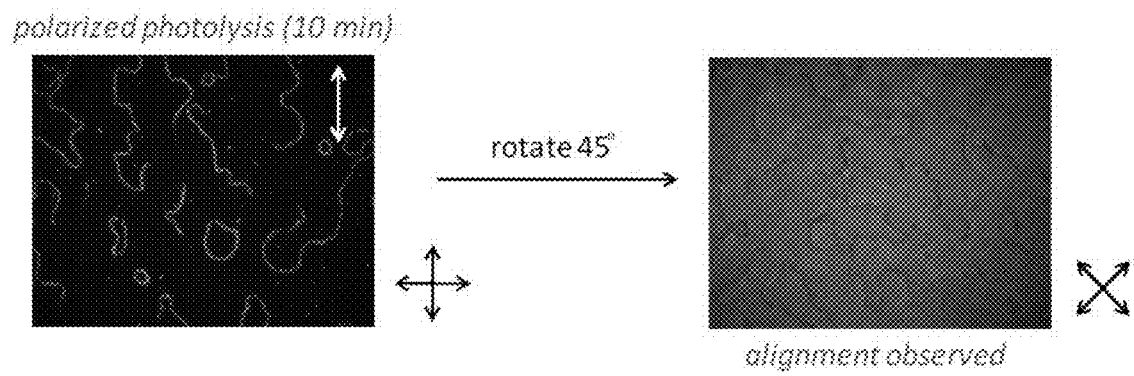

FIG. 14 shows the optical micrographs of the LC cells where (a) photopolymer P1 has not been irradiated or (b) has been irradiated with polarized light. Irradiation was carried out for 10 minutes in air (LC=MLC 6884), and the black arrows correspond to the orientation of the polarizers. (FIG. 14) In the case where the photoalignment layers were oriented parallel to each other, no light was expected to pass through the cell when the LC director is parallel to either of the two polarizers when crossed. However, if the cell was rotated off-axis (45° angle relative to either polarizer), then light was expected to pass through the cell. As can be seen in FIG. 14A, LC cells that have not been irradiated displayed no alignment whatsoever. This is indicated by the consistent brightness of the cells when rotated by the indicated amount. As shown in FIG. 14B, when the cells have been irradiated with polarized light, uniform alignment was observed, without a schlieran texture, that displayed extinction when one of the polarizers was aligned with the direction of the polarization of the photolysis. The cell became bright when the cell directions was turned so that its alignment acid was oriented at 45° to the crossed polarizers of the microscope. The alternation between bright and dark states upon rotation of the cell was evident and consistent with LC alignment.

Figure 15:
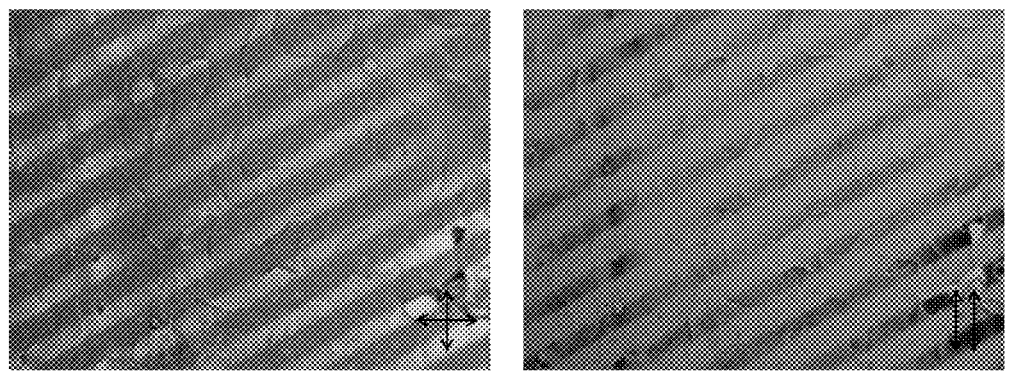
FIG. 15 shows optical micrographs of LC cells viewed through (a) crossed polarizers or (b) parallel polarizers, where the photopolymer P1 was irradiated through a polarizer and striped photomask.

To further probe the utility of this approach, a more elaborate pattern was created by using photomasks in conjunction with the polarized irradiation. FIG. 15 shows optical micrographs of LC cells viewed through (a) crossed polarizers or (b) parallel polarizers, where the photopolymer P1 was irradiated through a polarizer and striped photomask. Irradiation was carried out for 10 minutes in air (LC=MLC 6884). The alternating stripes correspond to features of 100 µm, and the black arrows correspond to the orientation of the polarizers. The non-irradiated regions were expected to exhibit no alignment; however, both irradiated and non-irradiated regions displayed significant alignment. Interestingly, FIG. 15 shows that the two regions are aligned orthogonal to one another. Without wishing to be bound by theory, this may be due to swelling of the polymer in the irradiated regions which would generate a surface topography of alternating ridges and valleys. It has been shown previously that such surface patterns are capable of aligning LC mesogens.

In conclusion, the design and synthesis of two new photoresponsive polymers that are capable of undergoing the di-π-methane rearrangement was demonstrated. The polymers contained triplet sensitizers within the polymer backbone that are capable of sensitizing the reaction via triplet-triplet Dexter energy transfer. In addition, these polymers were shown to be capable of aligning liquid crystal mesogens by exploiting the IFV of dibenzobarrelene structures.

Having thus described several aspects of some embodiments of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed:
1. A polymer, comprising:
a photoreactive species comprising an sp³-hybridized carbon covalently bonded to at least two carbon-carbon double bond groups, wherein the photoreactive species is able to undergo a di-pi-methane rearrangement upon exposure to electromagnetic radiation.

2. A device, comprising:
an anisotropic material; and
a photoreactive material in contact with the anisotropic material, the photoreactive material comprising a species comprising an sp³-hybridized carbon covalently bonded to at least two carbon-carbon double bond groups, wherein the species undergoes a di-pi-methane rearrangement upon exposure to electromagnetic radiation.

3. A polymer, comprising:
a group having the following structure,

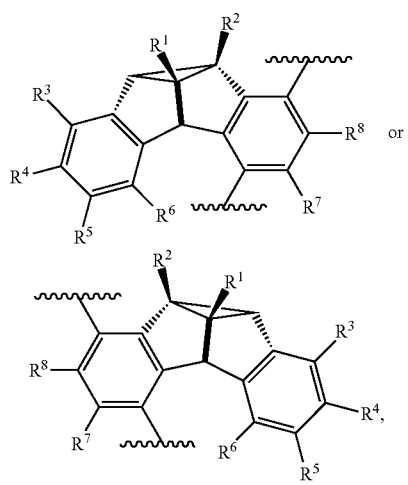

wherein:
$R^1$ and $R^2$ can be the same or different and are hydrogen, alkyl, aryl, heteroalkyl, heteroaryl, a carbonyl group, halo, hydroxyl, amino, nitro, or cyano, any of which is optionally substituted, or, $R^1$ and $R^2$ are joined together to form an optionally substituted ring; and
$R^{3-8}$ can be the same or different and are hydrogen, alkyl, aryl, heteroalkyl, heteroaryl, a carbonyl group, halo, hydroxyl, amino, nitro, or cyano, any of which is optionally substituted.

4. A device, comprising:
an anisotropic material; and
an alignment material comprising a photoproduct of a di-pi-methane rearrangement in physical contact with the anisotropic material.

5. A method, comprising:
providing a polymer comprising a photoreactive species comprising an sp³-hybridized carbon covalently bonded to at least two carbon-carbon double bond groups; and
exposing the polymer to electromagnetic radiation under conditions sufficient to promote a di-pi-methane rearrangement, thereby forming a photoproduct.

6. A method for alignment of an anisotropic material, comprising:
exposing a material comprising a photoreactive species to electromagnetic radiation to produce a photoproduct via a di-pi-methane rearrangement of the photoreactive species; and
arranging an anisotropic material in contact with the material.

7. A polymer as in claim 1, wherein the photoreactive species is attached to the polymer via at least two atoms of the photoreactive species.

8. A polymer as in claim 1, wherein the polymer backbone exhibits a glass transition temperature above room temperature.

9. A polymer as in claim 1, further comprising a sensitizer group.

10. A polymer as in claim 1, having the following structure:

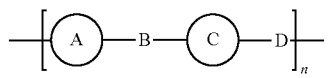

wherein:

A is an aromatic group and comprises the photoreactive species;

C is a sensitizer group;

B and D can be the same or different and are absent, optionally substituted carbon-carbon double bonds, or carbon-carbon triple bonds; and n is greater than 1.

11. A polymer as in claim 1, wherein the photoreactive species has the following structure:

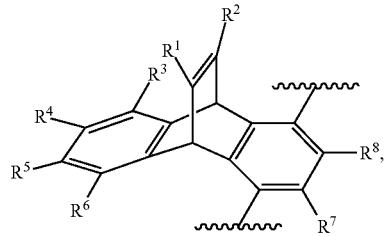

wherein:

$R^1$ and $R^2$ can be the same or different and are hydrogen, alkyl, aryl, heteroalkyl, heteroaryl, a carbonyl group, halo, hydroxyl, amino, nitro, or cyano, any of which is optionally substituted, or, $R^1$ and $R^2$ are joined together to form an optionally substituted ring; and $R^{3-8}$ can be the same or different and are hydrogen, alkyl, aryl, heteroalkyl, heteroaryl, a carbonyl group, halo, hydroxyl, amino, nitro, or cyano, any of which is optionally substituted.

12. A polymer as in claim 1, comprising the structure:

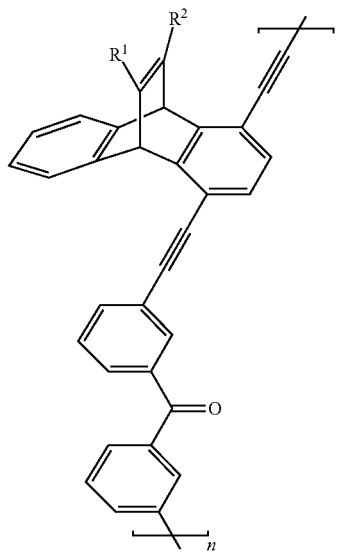

or

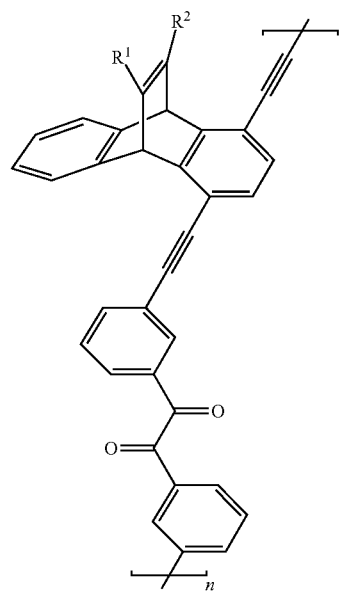

wherein:

$R^1$ and $R^2$ can be the same or different and are hydrogen, alkyl, aryl, heteroalkyl, heteroaryl, a carbonyl group, halo, hydroxyl, amino, nitro, or cyano, any of which is optionally substituted, or, $R^1$ and $R^2$ are joined together to form an optionally substituted ring; and n is greater than 1.

13. A polymer as in claim 12, comprising the structure:

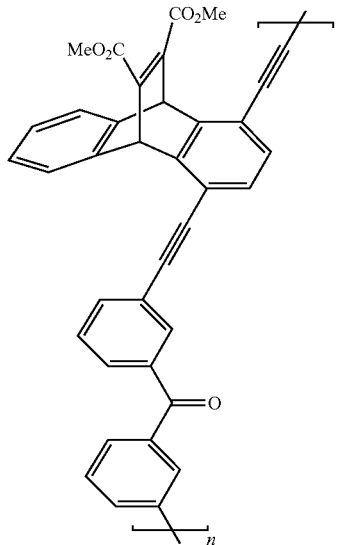

or

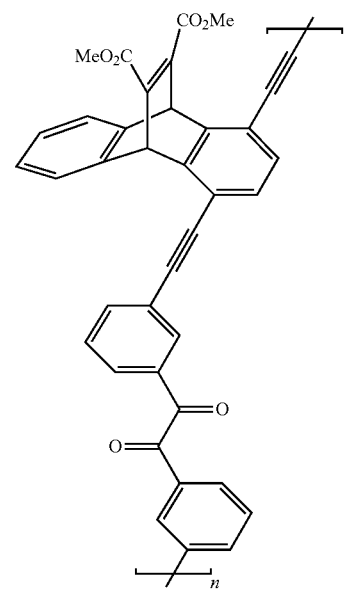

14. A polymer as in claim 3, wherein:

$R^1$ and $R^2$ can be the same or different and are hydrogen, alkyl, aryl, or a carbonyl group, any of which is optionally substituted, or, $R^1$ and $R^2$ are joined together to form an optionally substituted ring; and $R^{3-8}$ can be the same or different and are hydrogen, alkyl, aryl, or a carbonyl group, any of which is optionally substituted.

15. A polymer as in claim 3, wherein the polymer has the following structure,

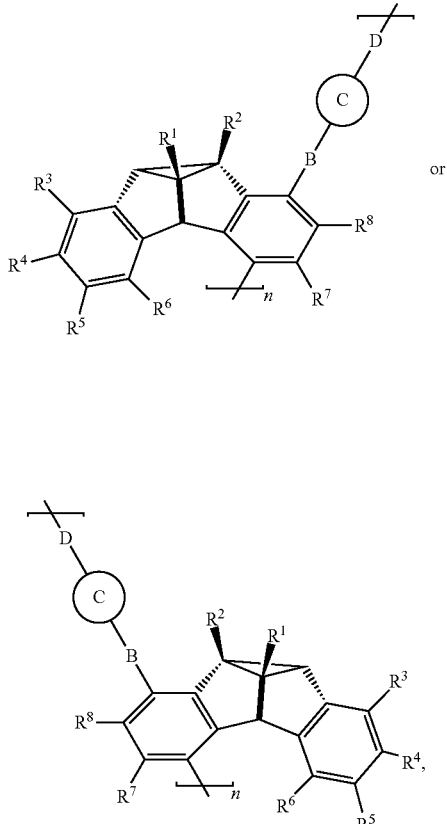

wherein:

C is a sensitizer group;

B and D can be the same or different and are absent, optionally substituted carbon-carbon double bonds, or carbon-carbon triple bonds; and n is greater than 1.

16. A polymer as in claim 3, comprising the structure:

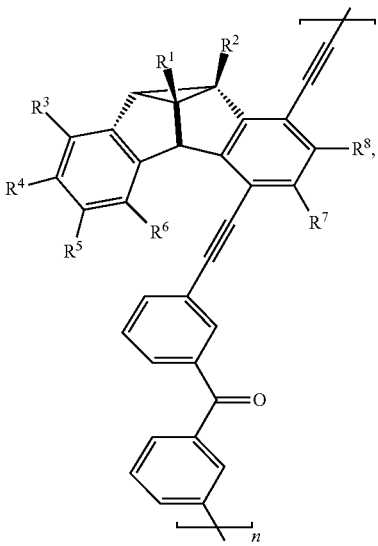

-continued
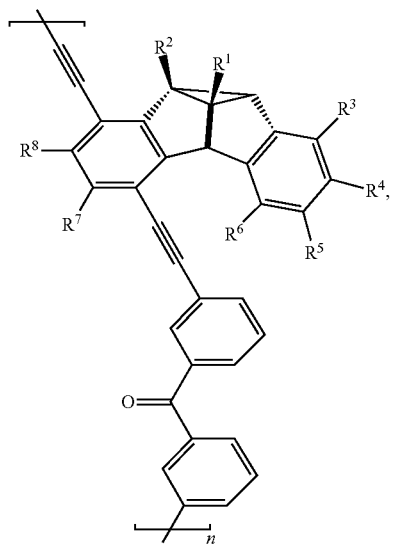
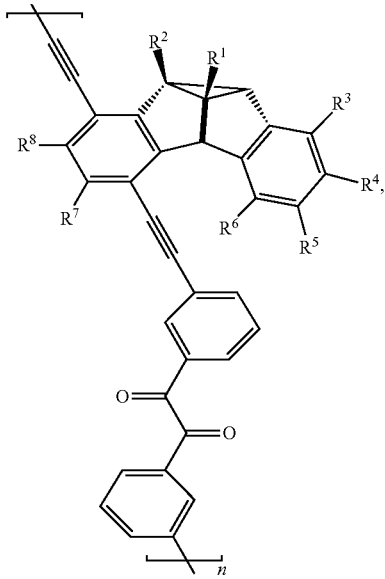
wherein:
R[1] and R[2] can be the same or different and are hydrogen, alkyl, aryl, heteroalkyl, heteroaryl, a carbonyl group, halo, hydroxyl, amino, nitro, or cyano, any of which is optionally substituted, or, R[1] and R[2] are joined together to form an optionally substituted ring; and
n is greater than 1.
17. A polymer as in claim 16, comprising the structure:
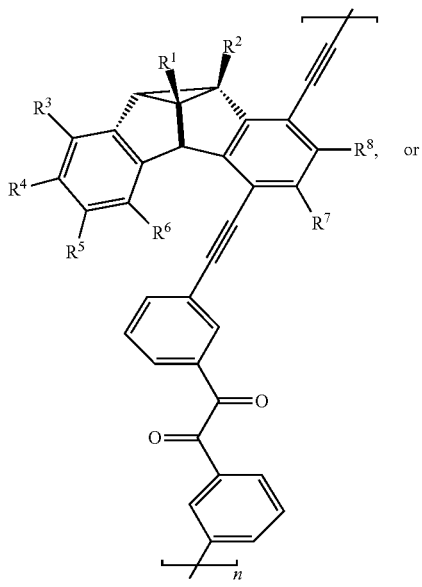 or
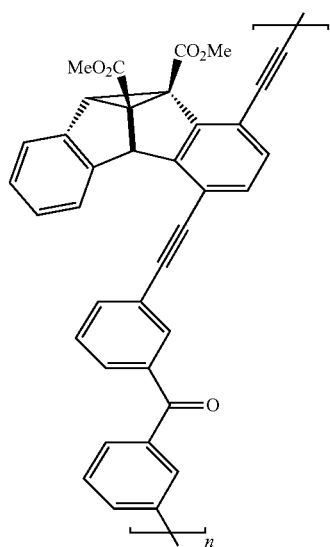

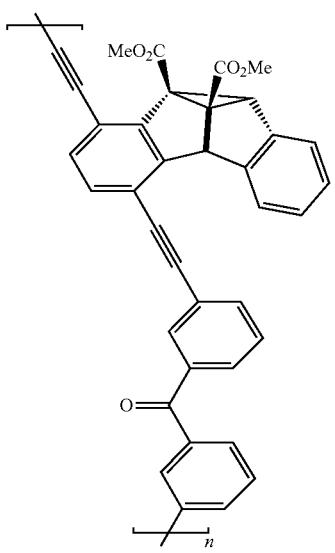

,

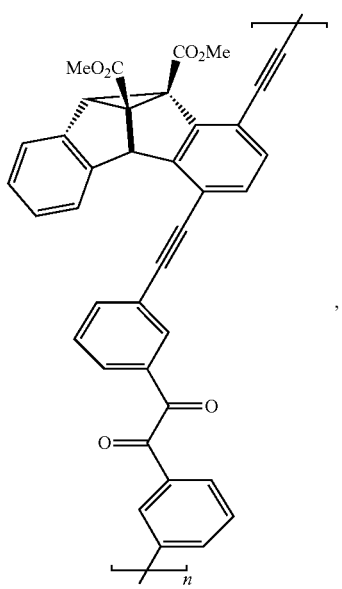

,

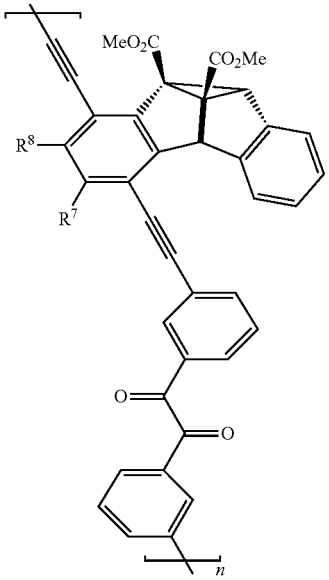

18. A method as in claim 5, further comprising subjecting the photoproduct to thermal treatment, wherein the thermal treatment of the photoproduct results in a change in the chemical structure of the photoproduct.

19. A method as in claim 5, wherein the polymer has the following structure:

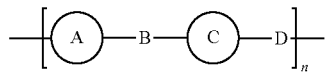

wherein:
A is an aromatic group and comprises the photoreactive species;
C is a sensitizer group;
B and D can be the same or different and are absent, optionally substituted carbon-carbon double bonds, or carbon-carbon triple bonds; and
n is greater than 1.

20. A method as in claim 5, wherein the photoreactive species has the following structure:

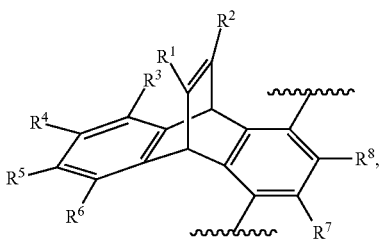

wherein:
$R^1$ and $R^2$ can be the same or different and are hydrogen, alkyl, aryl, heteroalkyl, heteroaryl, a carbonyl group, halo, hydroxyl, amino, nitro, or cyano, any of which is optionally substituted, or, $R^1$ and $R^2$ are joined together to form an optionally substituted ring; and $R^{3-8}$ can be the same or different and are hydrogen, alkyl, aryl, heteroalkyl, heteroaryl, a carbonyl group, halo, hydroxyl, amino, nitro, or cyano, any of which is optionally substituted.

21. A method as in claim 5, wherein, upon formation of the photoproduct via the di-pi-methane rearrangement, a directional change in the polymer occurs that substantially does not relax through conformational changes of the polymer.

22. A device as in claim 2, wherein the anisotropic material comprises a liquid crystal, a polymer, or nanoparticles.

23. A device as in claim 4, wherein the anisotropic material comprises a liquid crystal, a polymer, or nanoparticles.

24. A method as in claim 6, further comprising subjecting the photoproduct to thermal treatment.

\* \* \* \* \*